US011469251B2

(12) United States Patent
Zhang et al.

(10) Patent No.: US 11,469,251 B2
(45) Date of Patent: Oct. 11, 2022

(54) MEMORY DEVICE USING A MULTILAYER FERROELECTRIC STACK AND METHOD OF FORMING THE SAME

(71) Applicant: SANDISK TECHNOLOGIES LLC, Addison, TX (US)

(72) Inventors: Yanli Zhang, San Jose, CA (US); Johann Alsmeier, San Jose, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 380 days.

(21) Appl. No.: 16/412,764

(22) Filed: May 15, 2019

(65) Prior Publication Data

US 2020/0365618 A1 Nov. 19, 2020

(51) Int. Cl.
| | |
|---|---|
| *H01L 27/11597* | (2017.01) |
| *H01L 27/1159* | (2017.01) |
| *H01L 27/11592* | (2017.01) |
| *H01L 27/11587* | (2017.01) |

(52) U.S. Cl.
CPC .... *H01L 27/11597* (2013.01); *H01L 27/1159* (2013.01); *H01L 27/11587* (2013.01); *H01L 27/11592* (2013.01)

(58) Field of Classification Search
CPC combination set(s) only.
See application file for complete search history.

(56) References Cited

U.S. PATENT DOCUMENTS

| | | | |
|---|---|---|---|
| 5,877,977 A | 3/1999 | Essaian | |
| 5,915,167 A | 6/1999 | Leedy | |
| 6,046,929 A | 4/2000 | Aoki et al. | |
| 8,349,681 B2 | 1/2013 | Alsmeier et al. | |
| 9,530,790 B1* | 12/2016 | Lu | H01L 27/11573 |
| 9,558,804 B2 | 1/2017 | Muller | |
| 9,589,839 B1 | 3/2017 | Ikawa et al. | |
| 9,780,182 B2 | 10/2017 | Peri et al. | |
| 9,806,093 B2 | 10/2017 | Toyama et al. | |
| 9,865,608 B2 | 1/2018 | Mueller et al. | |
| 9,941,299 B1 | 4/2018 | Chen et al. | |
| 9,984,963 B2 | 5/2018 | Peri et al. | |
| 10,038,092 B1 | 7/2018 | Chen et al. | |
| 10,199,351 B2 | 2/2019 | Flores et al. | |

(Continued)

FOREIGN PATENT DOCUMENTS

| | | |
|---|---|---|
| CN | 107863351 A | 3/2018 |
| NO | WO2017142806 A1 | 8/2017 |

OTHER PUBLICATIONS

Notification of Transmittal of the International Search Report and Written Opinion of the International Search Authority for International Patent Application No. PCT/US2019/068866, dated Apr. 7, 2020, 9 pages.

(Continued)

*Primary Examiner* — Mark W Tornow
*Assistant Examiner* — Priya M Rampersaud
(74) *Attorney, Agent, or Firm* — The Marbury Law Group PLLC

(57) ABSTRACT

A memory device includes a semiconductor channel, a gate electrode, and a stack located between the semiconductor channel and the gate electrode. The stack includes, from one side to another, a first ferroelectric material portion, a second ferroelectric material portion, and a gate dielectric portion that contacts the semiconductor channel.

1 Claim, 32 Drawing Sheets

(56) References Cited

U.S. PATENT DOCUMENTS

| | | | |
|---|---|---|---|
| 2015/0076586 A1* | 3/2015 | Rabkin | H01L 27/11578 257/324 |
| 2016/0225866 A1 | 8/2016 | Peri et al. | |
| 2016/0351497 A1 | 12/2016 | Peri et al. | |
| 2017/0148811 A1* | 5/2017 | Zhang | H01L 28/00 |
| 2017/0179152 A1 | 6/2017 | Toyama et al. | |
| 2017/0194284 A1 | 7/2017 | Flores et al. | |
| 2017/0352669 A1* | 12/2017 | Sharangpani | H01L 23/53266 |
| 2019/0019553 A1 | 1/2019 | Derner et al. | |
| 2019/0139973 A1* | 5/2019 | Zhou | H01L 27/11573 |
| 2019/0296122 A1* | 9/2019 | Ino | H01L 27/11597 |

OTHER PUBLICATIONS

Endoh, T. et al., "Novel Ultra High Density Flash Memory with a Stacked-Surrounding Gate Transistor (S-GT) Structured Cell," IEDM Proc., pp. 33-36, (2001).

Chauhan, Y. S., "Negative Capacitance MOSFETs for Future Technology Nodes," *Nanolab,* Department of Electrical Engineering IIT Kanpur, India, Presentation, pp. 1-68, (2017).

Khan, A. I. et al., "Negative capacitance in a ferroelectric capacitor," Nature Materials Letters, vol. 14, pp. 182-186, (2015).

Li, K.S. et al., "Sub-60mV-Swing Negative-Capacitance FinFET without Hysteresis," IEDM 2015 Proceedings, 22.6.1-22.6.4, IEDM15-620-623, (2015).

Muller, J. et al., "Ferroelectric Hafnium Oxide Based Materials and Devices: Assessment of Current Status and Future Prospects," ECS Journal of Solid State Science and Technology, vol. 4, No. 5, pp. N30-N35, (2015).

Muller, J. et al., "Ferroelectric Hafnium Oxide: A CMOS-Compatible and Highly Scalable Approach to Future Ferroelectric Memories," IEDM 2013 Proceedings, 280-283, 10.8.1-10.8.4, (2013).

Muller, J. et al., "Ferroelectricity in Simple Binary $ZrO_2$ and $HfO_2$," Nano Letters, vol. 12, pp. 4318-4323, (2012).

Pahwa, G. et al., "Physical Insights on Negative Capacitance Transistors in Nonhysteresis and Hysteresis Regimes: MFMIS Versus MFIS Structures," IEEE Transactions on Electron Devices, vol. 65, No. 3, pp. 867-873, (2018).

Salahuddin, S. et al., "Use of Negative Capacitance to Provide Voltage Amplification for Low Power Nanoscale Devices," Nano Letters, vol. 8, No. 2, pp. 405-410, (2008).

Yurchuk, E., "Electrical Characterisation of Ferroelectric Field Effect Transistors Based on Ferroelectric HfO2 Thin Films," PhD Thesis, Technischen Universität Dresden, 2014.

U.S. Appl. No. 15/873,101, filed Jan. 17, 2018, SanDisk Technologies LLC.

U.S. Appl. No. 16/227,889, filed Dec. 20, 2018, SanDisk Technologies LLC.

U.S. Appl. No. 16/249,300, filed Jan. 16, 2019, SanDisk Technologies LLC.

U.S. Appl. No. 16/291,673, filed Mar. 4, 2019, SanDisk Technologies LLC.

U.S. Appl. No. 16/374,330, filed Apr. 3, 2019, SanDisk Technologies LLC.

\* cited by examiner

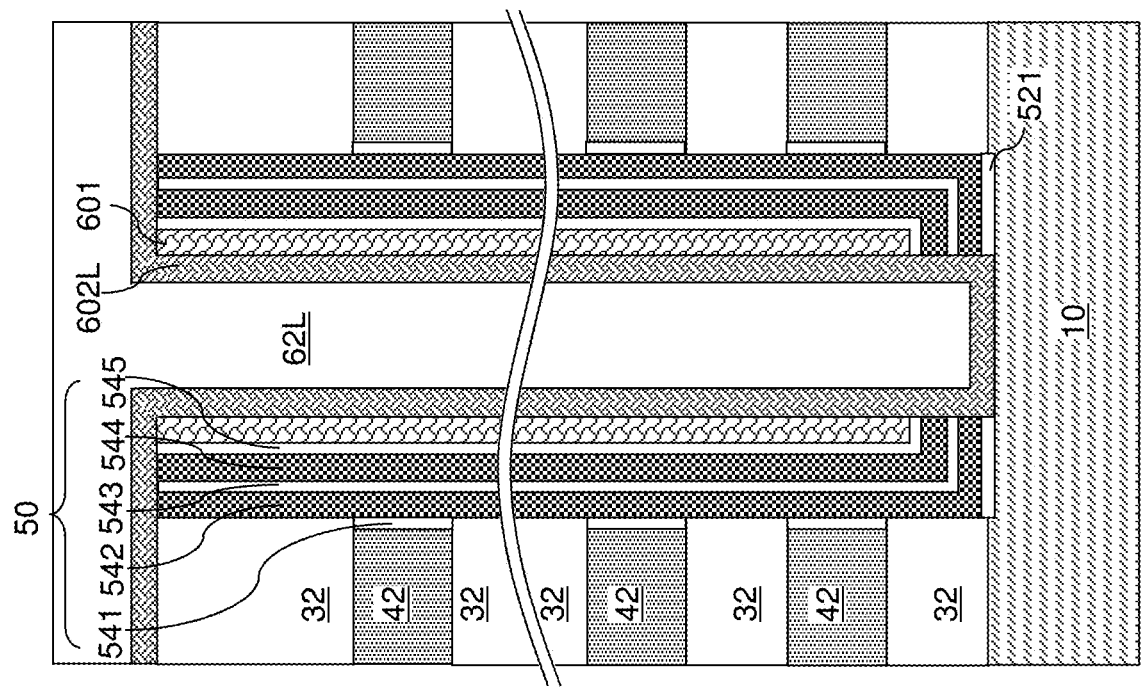
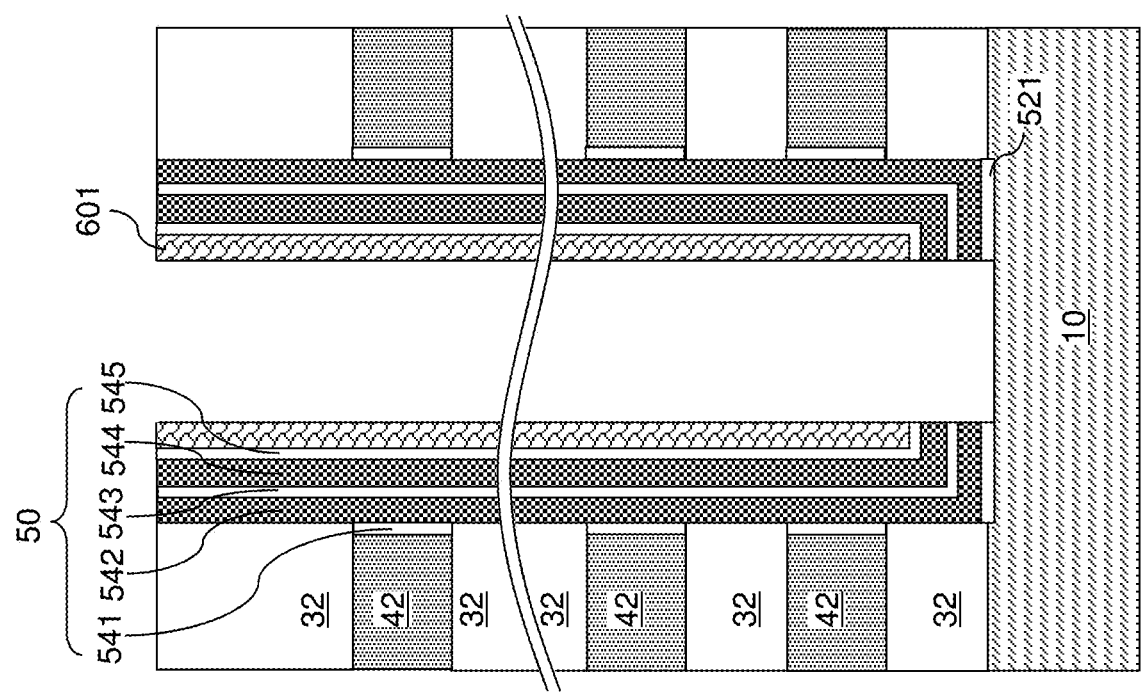

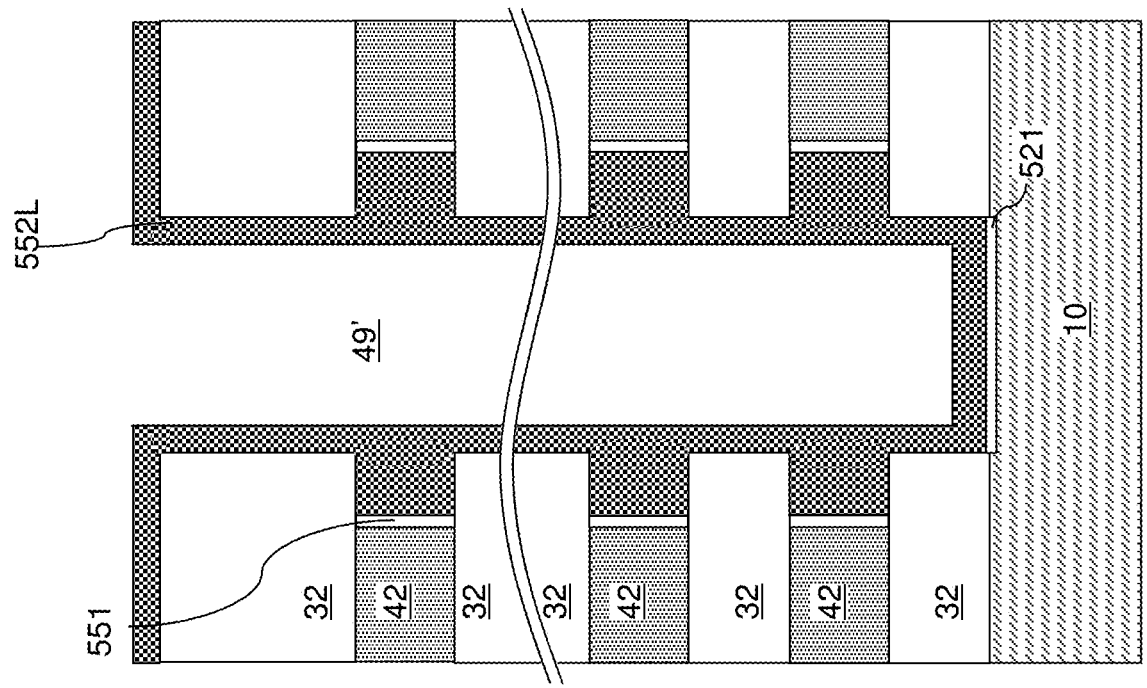
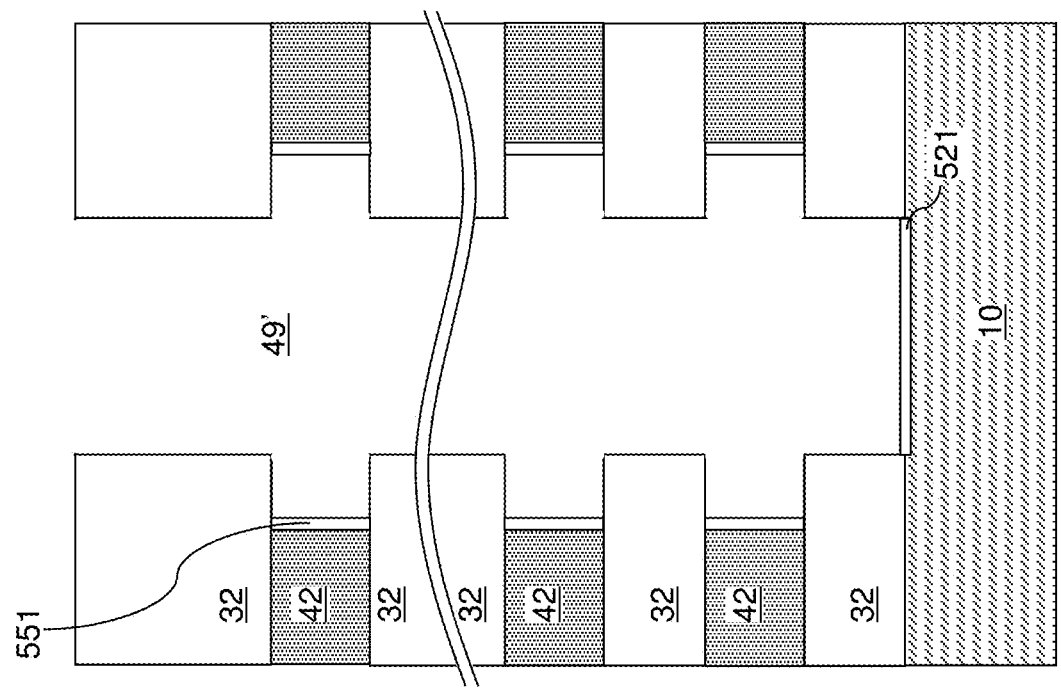

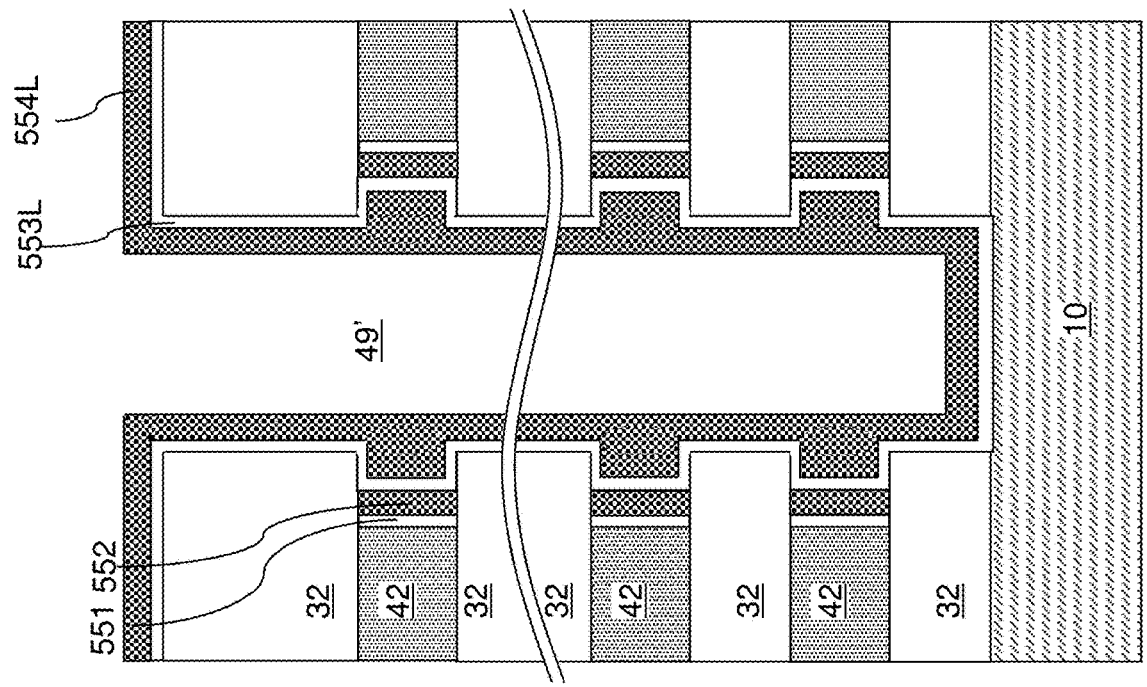
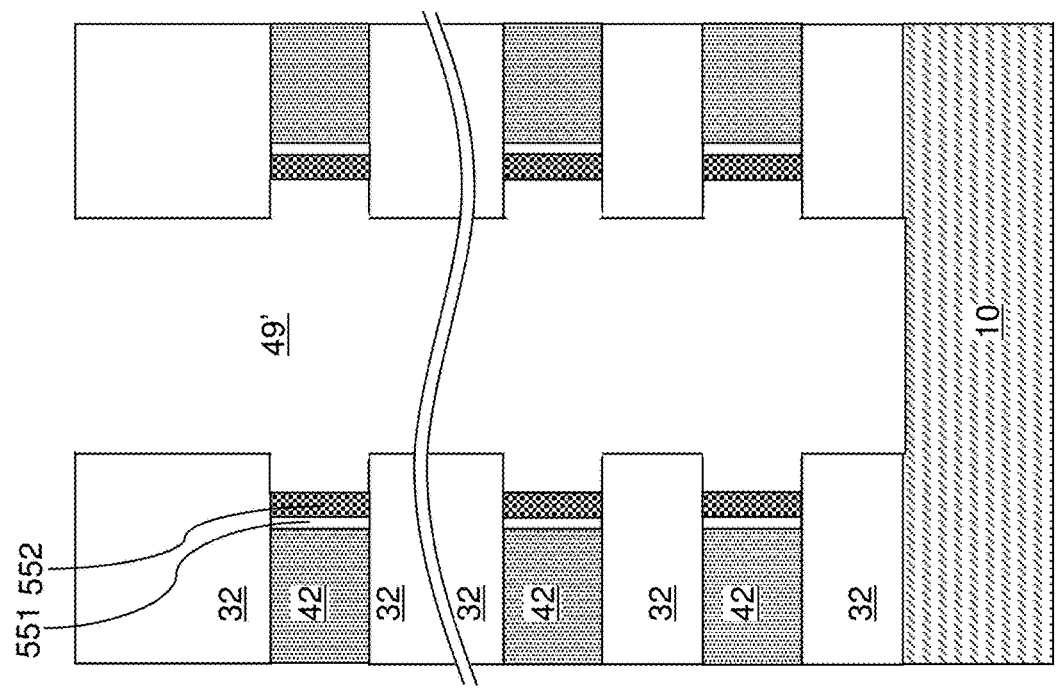

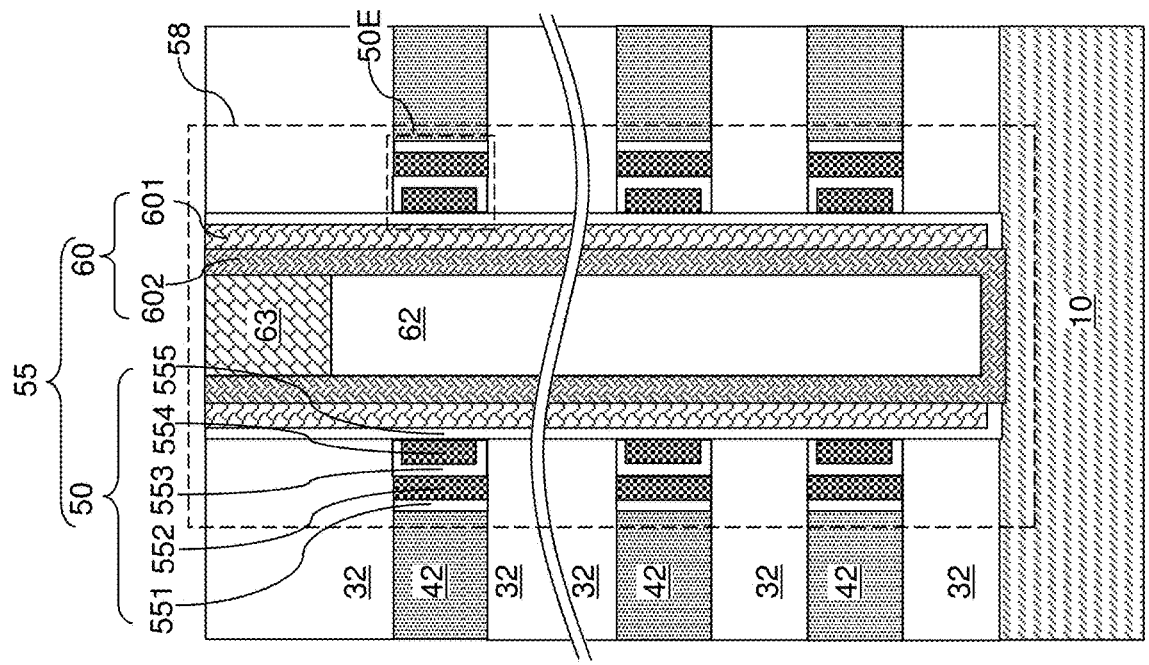
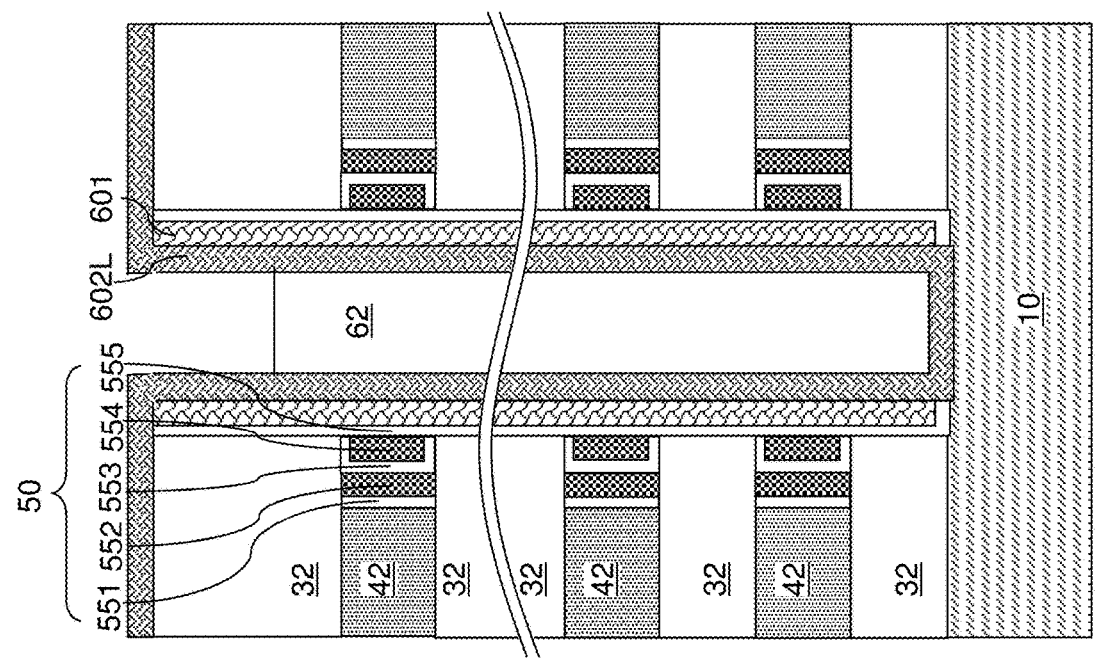

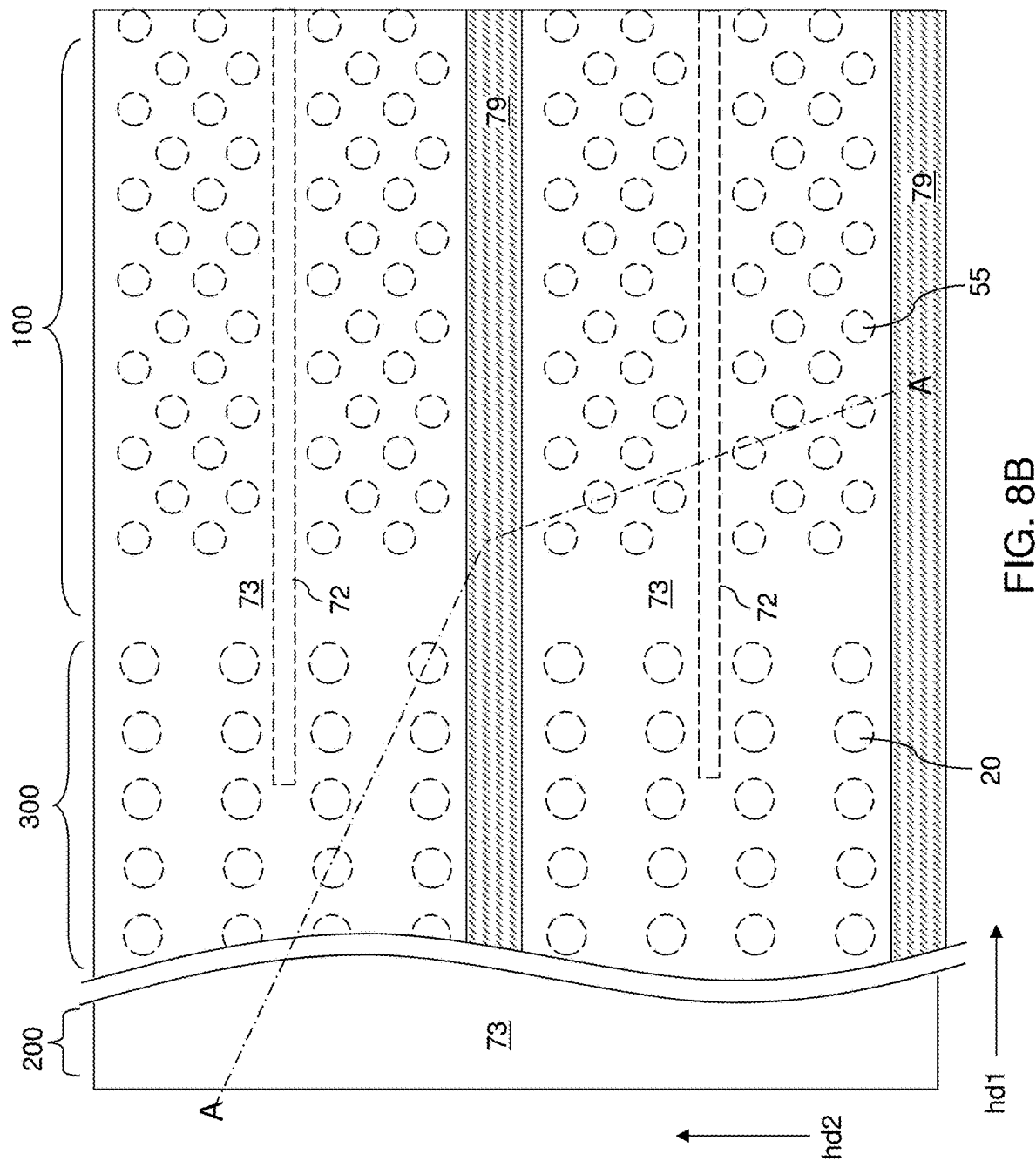

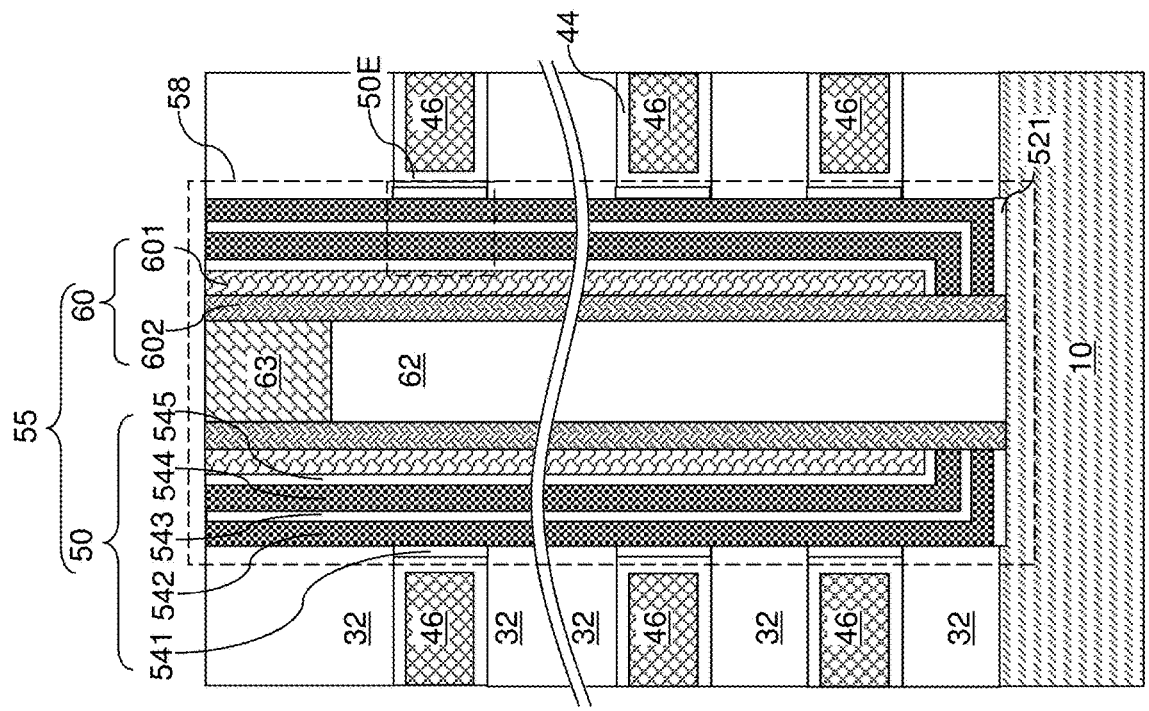
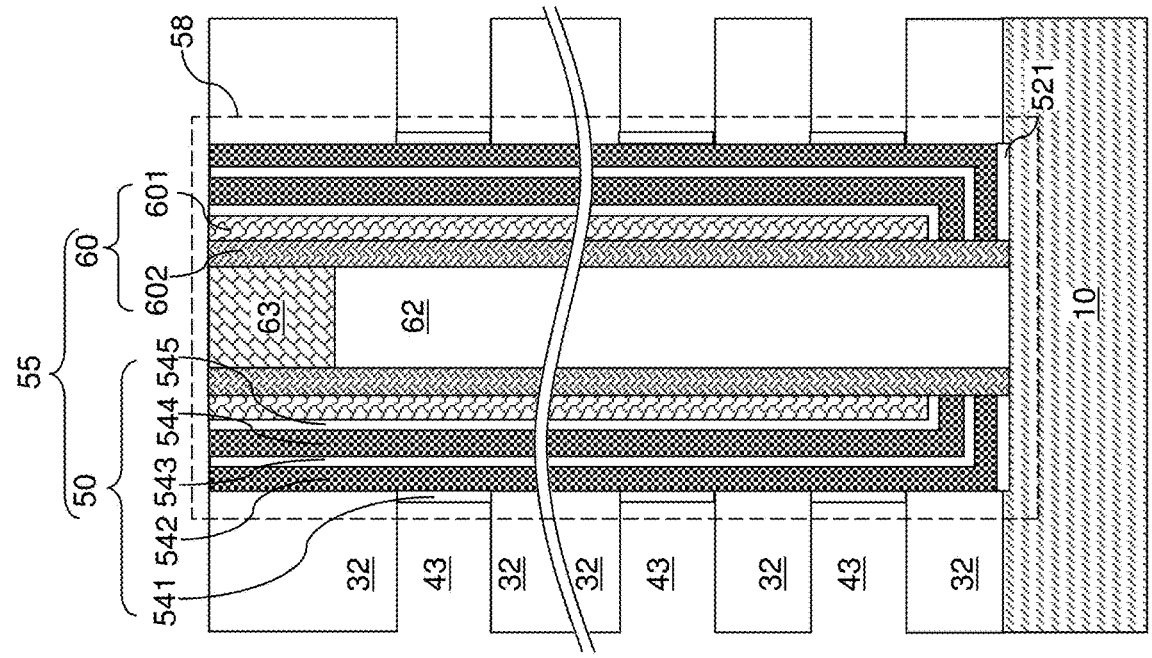
FIG. 10B
FIG. 10A

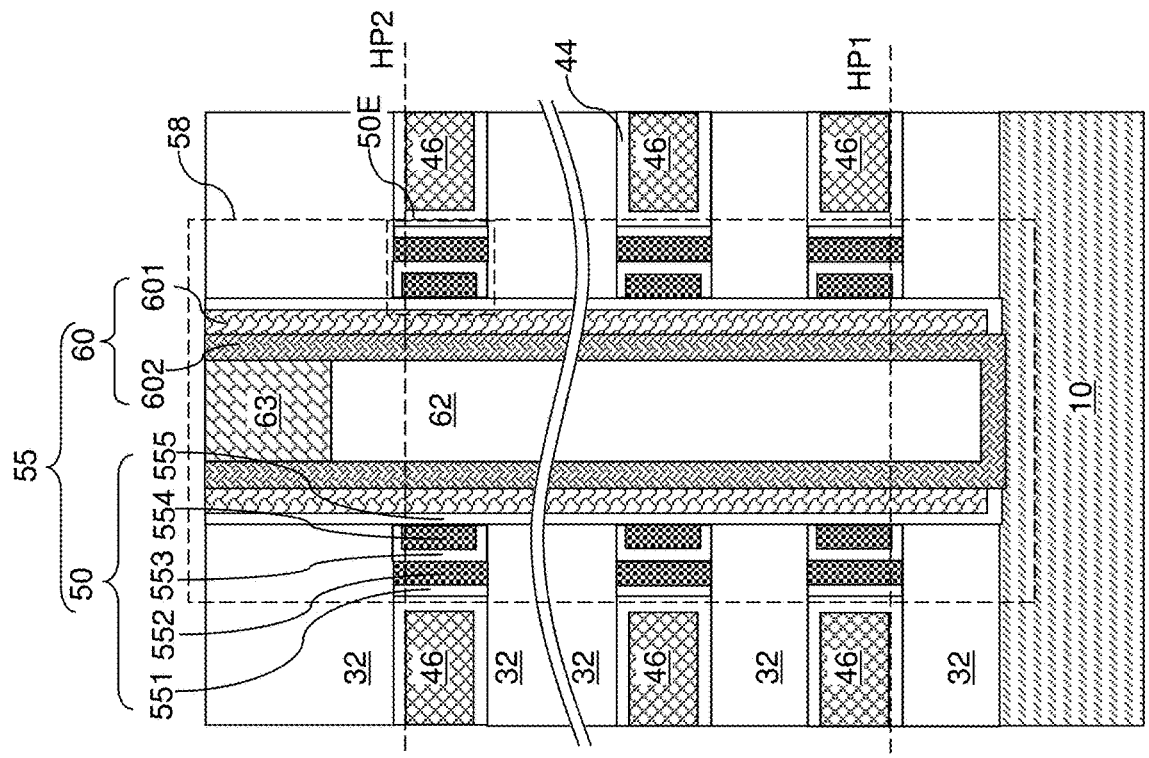
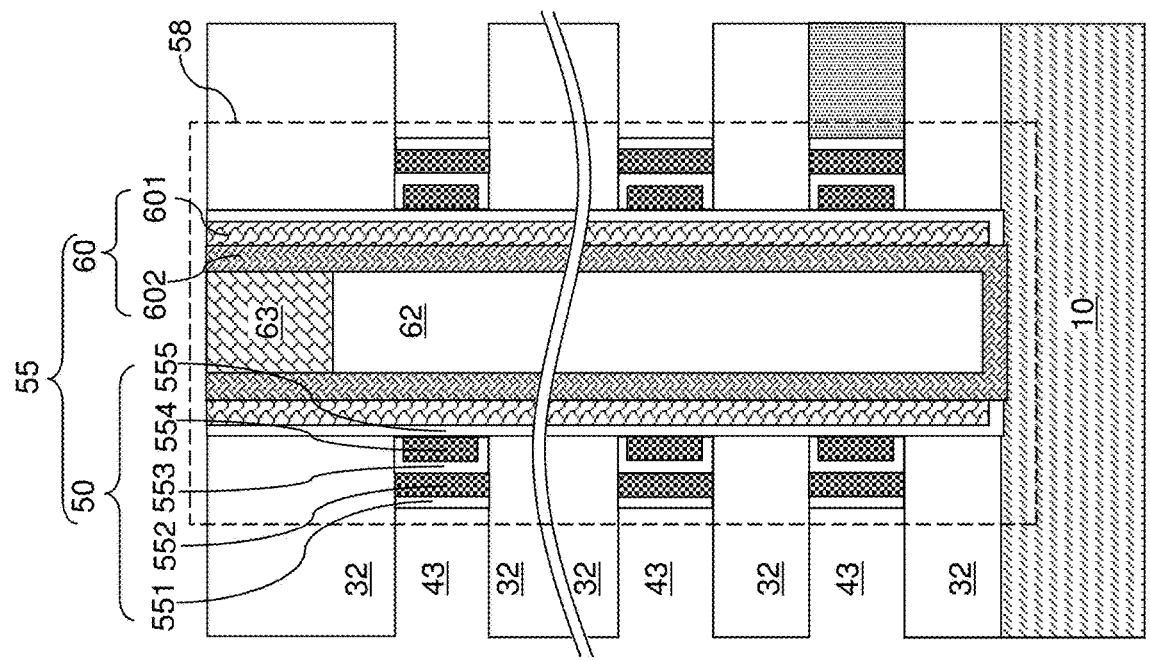
FIG. 11A
FIG. 11B

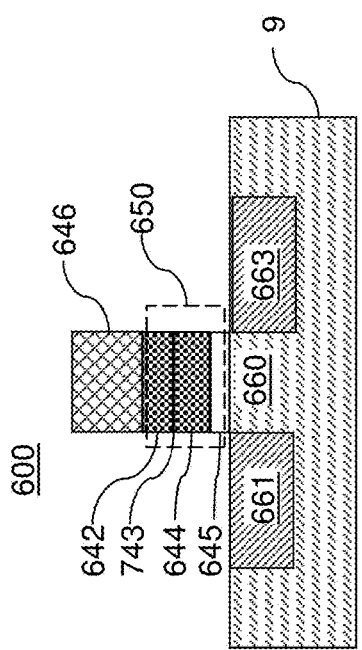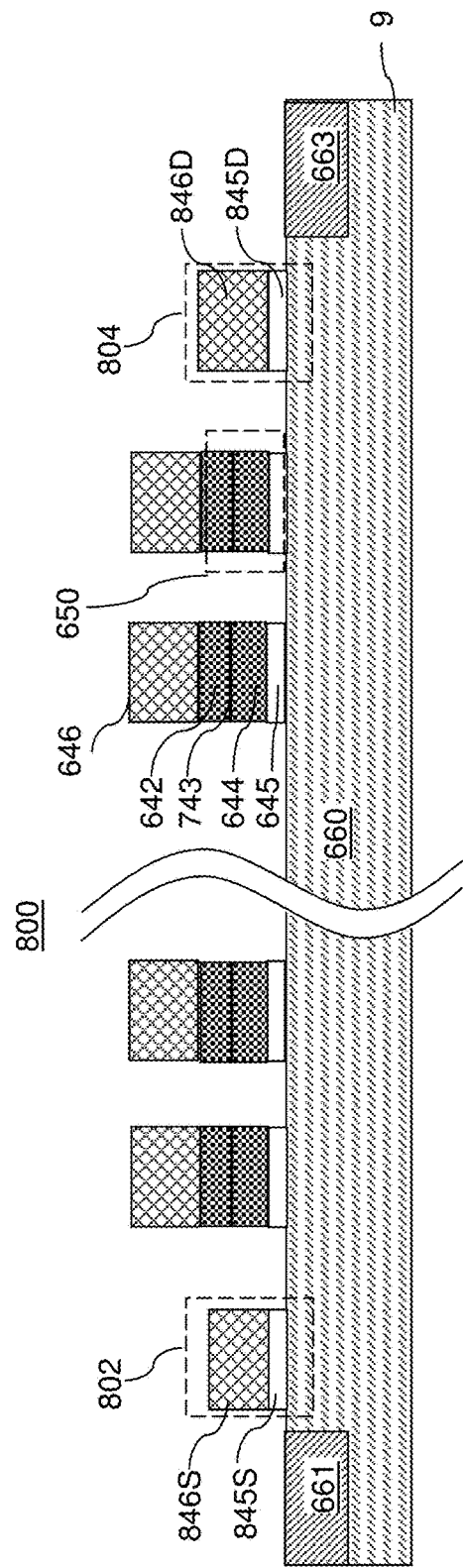

MEMORY DEVICE USING A MULTILAYER FERROELECTRIC STACK AND METHOD OF FORMING THE SAME

FIELD

The present disclosure relates generally to the field of semiconductor memory devices, and in particular to a three-dimensional memory device using a multilayer ferroelectric stack and methods of manufacturing the same.

BACKGROUND

A ferroelectric material refers to a material that displays spontaneous polarization of electrical charges in the absence of an applied electric field. The net polarization P of electrical charges within the ferroelectric material is non-zero in the minimum energy state. Thus, spontaneous ferroelectric polarization of the material occurs, and the ferroelectric material accumulates surfaces charges of opposite polarity types on two opposing surfaces. Polarization P of a ferroelectric material as a function of an applied voltage V thereacross displays hysteresis. The product of the remanent polarization and the coercive field of a ferroelectric material is a metric for characterizing effectiveness of the ferroelectric material.

A ferroelectric memory device is a memory device containing the ferroelectric material which is used to store information. The ferroelectric material acts as the memory material of the memory device. The dipole moment of the ferroelectric material is programmed in two different orientations (e.g., "up" or "down" polarization positions based on atom positions, such as oxygen and/or metal atom positions, in the crystal lattice) depending on the polarity of the applied electric field to the ferroelectric material to store information in the ferroelectric material. The different orientations of the dipole moment of the ferroelectric material can be detected by the electric field generated by the dipole moment of the ferroelectric material. For example, the orientation of the dipole moment can be detected by measuring electrical current passing through a semiconductor channel provided adjacent to the ferroelectric material in a field effect transistor ferroelectric memory device.

SUMMARY

According to an embodiment of the present disclosure, a memory device includes a semiconductor channel, a gate electrode, and a stack located between the semiconductor channel and the gate electrode. The stack includes, from one side to another, a first ferroelectric material portion, a second ferroelectric material portion, and a gate dielectric portion that contacts the semiconductor channel.

According to another embodiment of the present disclosure, a method of forming three-dimensional memory device is provided, which comprises: forming an alternating stack of insulating layers and spacer material layers over a substrate, wherein the spacer material layer are formed as, or are subsequently replaced with, electrically conductive layers; forming a memory opening through the alternating stack; forming a memory film in the memory opening, wherein the memory film comprises a vertical stack of ferroelectric memory cells that are located at each level of the spacer material layers, and wherein each of the ferroelectric memory cells comprises a lateral stack including, from one side to another, a barrier dielectric portion, a first ferroelectric material portion, a second ferroelectric material portion, and a gate dielectric portion; and forming a vertical semiconductor channel on the memory film.

BRIEF DESCRIPTION OF THE DRAWINGS

FIGS. 5A-5H are sequential schematic vertical cross-sectional views of a memory opening within the exemplary structure during formation of a first exemplary memory opening fill structure according to an embodiment of the present disclosure.

FIGS. 6A-6L are sequential schematic vertical cross-sectional views of a memory opening within the exemplary structure during formation of a second exemplary memory opening fill structure according to an embodiment of the present disclosure.

FIG. 8B is a partial see-through top-down view of the exemplary structure of FIG. 8A. The vertical plane A-A' is the plane of the schematic vertical cross-sectional view of FIG. 7A.

FIGS. 10A and 10B are sequential vertical cross-sectional views of a region of the exemplary structure including a first exemplary memory opening fill structure during formation of electrically conductive layers according to an embodiment of the present disclosure.

FIGS. 11A and 11B are sequential vertical cross-sectional views of a region of the exemplary structure including a second exemplary memory opening fill structure during formation of electrically conductive layers according to an embodiment of the present disclosure.

FIGS. 17A, 17B, 17C and 17D are schematic vertical cross-sectional views of the alternative structures of a fourth embodiment of the present disclosure.

DETAILED DESCRIPTION

Figure 1:
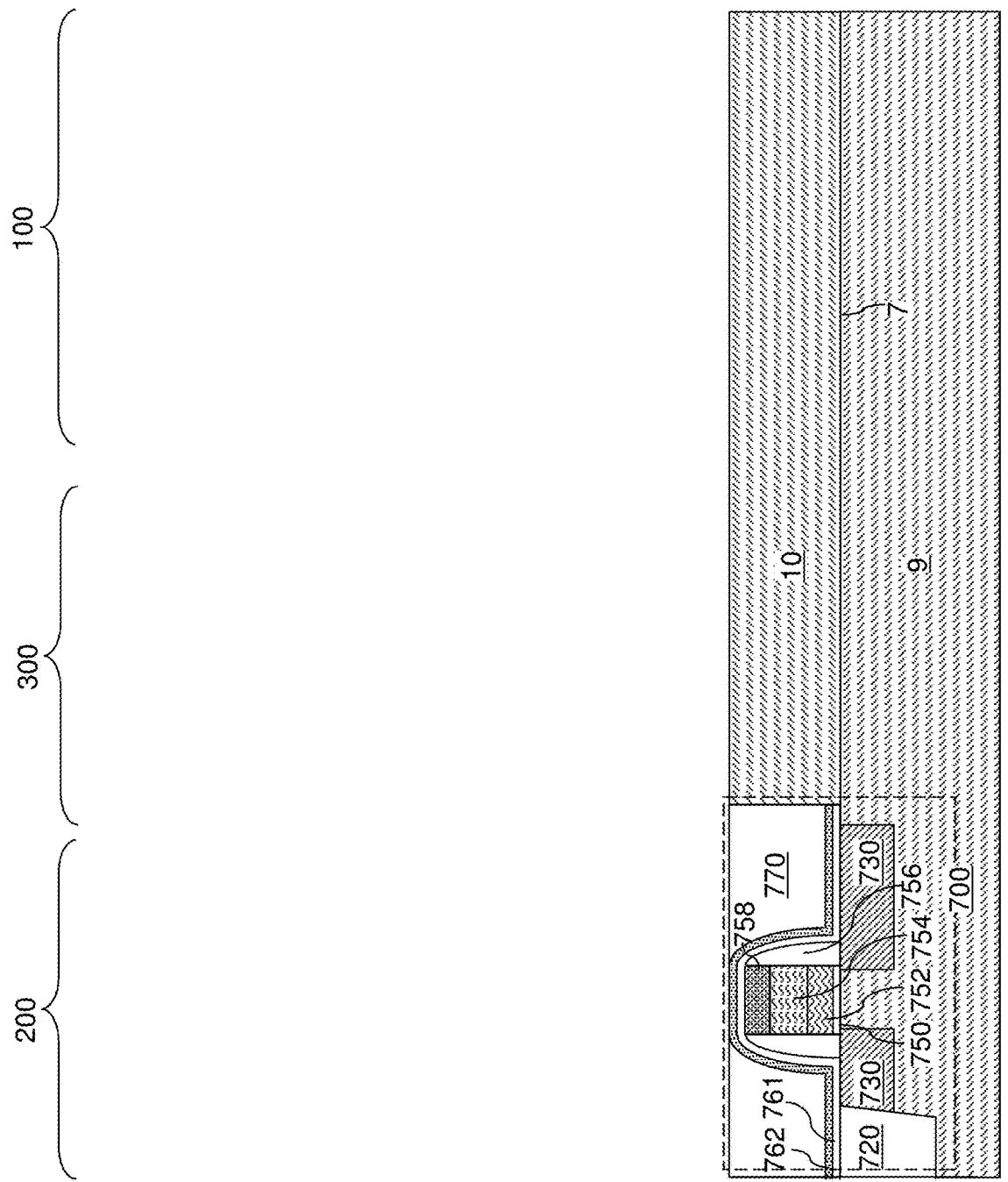
FIG. 1 is a schematic vertical cross-sectional view of an exemplary structure of a first embodiment of the present disclosure after formation of at least one peripheral device and a semiconductor material layer according to an embodiment of the present disclosure.

As discussed above, the present disclosure is directed to a ferroelectric memory device containing two or more ferroelectric layers between the gate and the channel. In one embodiment, the ferroelectric memory device may be a three-dimensional ferroelectric memory device containing a multilayer ferroelectric stack and methods of manufacturing the same, the various embodiments of which are described below. The embodiments of the disclosure may be used to form various structures including a multilevel memory structure, non-limiting examples of which include semiconductor devices such as three-dimensional monolithic memory array devices comprising a plurality of NAND memory strings.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are used merely to identify similar elements, and different ordinals may be used across the specification and the claims of the instant disclosure. The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. As used herein, a first element located "on" a second element may be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

As used herein, a first surface and a second surface are "vertically coincident" with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction.

A monolithic three-dimensional memory array is a memory array in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and may be fabricated using the various embodiments described herein.

Referring to FIG. 1, an exemplary structure according to a first embodiment of the present disclosure is illustrated, which may be used, for example, to fabricate a device structure containing vertical NAND memory devices. The exemplary structure may include a substrate (9, 10), which may be a semiconductor substrate. The substrate may include a substrate semiconductor layer 9 and an optional semiconductor material layer 10. The substrate semiconductor layer 9 maybe a semiconductor wafer or a semiconductor material layer, and may include at least one elemental semiconductor material (e.g., single crystal silicon wafer or layer), at least one III-V compound semiconductor material, at least one II-VI compound semiconductor material, at least one organic semiconductor material, or other semiconductor materials known in the art. The substrate may have a major surface 7, which may be, for example, a topmost surface of the substrate semiconductor layer 9. The major surface 7 may be a semiconductor surface. In one embodiment, the major surface 7 may be a single crystalline semiconductor surface, such as a single crystalline semiconductor surface.

As used herein, a "semiconducting material" refers to a material having electrical conductivity in the range from $1.0 \times 10^{-5}$ S/m to $1.0 \times 10^{5}$ S/m. As used herein, a "semiconductor material" refers to a material having electrical conductivity in the range from $1.0 \times 10^{-5}$ S/m to 1.0 S/m in the absence of electrical dopants therein, and is capable of producing a doped material having electrical conductivity in a range from 1.0 S/m to $1.0 \times 10^{5}$ S/m upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/m. As used herein, an "insulator material" or a "dielectric material" refers to a material having electrical conductivity less than $1.0 \times 10^{-5}$ S/m. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0 \times 10^{5}$ S/m. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-5}$ S/m to $1.0 \times 10^{5}$ S/m. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material may be semiconducting or conductive depending on the atomic concentration of electrical dopants therein. As used herein, a "metallic material" refers to a conductive material including at least one metallic element therein. All measurements for electrical conductivities are made at the standard condition.

At least one semiconductor device 700 for a peripheral circuitry may be formed on a portion of the substrate semiconductor layer 9. The at least one semiconductor device may include, for example, field effect transistors. For example, at least one shallow trench isolation structure 720 may be formed by etching portions of the substrate semiconductor layer 9 and depositing a dielectric material therein. A gate dielectric layer, at least one gate conductor layer, and a gate cap dielectric layer may be formed over the substrate semiconductor layer 9, and may be subsequently patterned to form at least one gate structure (750, 752, 754, 758), each of which may include a gate dielectric 750, a gate electrode (752, 754), and a gate cap dielectric 758. The gate electrode (752, 754) may include a stack of a first gate electrode portion 752 and a second gate electrode portion 754. At least one gate spacer 756 may be formed around the at least one gate structure (750, 752, 754, 758) by depositing and anisotropically etching a dielectric liner. Active regions 730 may be formed in upper portions of the substrate semiconductor layer 9, for example, by introducing electrical dopants using the at least one gate structure (750, 752, 754, 758) as masking structures. Additional masks may be used as needed. The active region 730 may include source regions and drain regions of field effect transistors. A first dielectric liner 761 and a second dielectric liner 762 may be optionally formed. Each of the first and second dielectric liners (761, 762) may comprise a silicon oxide layer, a silicon nitride layer, and/or a dielectric metal oxide layer. As used herein, silicon oxide includes silicon dioxide as well as non-stoichiometric silicon oxides having more or less than two oxygen atoms for each silicon atoms. Silicon dioxide is preferred. In an illustrative example, the first dielectric liner 761 may be a silicon oxide layer, and the second dielectric liner 762 may be a silicon nitride layer. The least one semiconductor device for the peripheral circuitry may contain a driver circuit for memory devices to be subsequently formed, which may include at least one NAND device.

A dielectric material such as silicon oxide may be deposited over the at least one semiconductor device, and may be subsequently planarized to form a planarization dielectric layer 770. In one embodiment the planarized top surface of the planarization dielectric layer 770 may be coplanar with a top surface of the dielectric liners (761, 762). Subsequently, the planarization dielectric layer 770 and the dielectric liners (761, 762) may be removed from an area to physically expose a top surface of the substrate semiconductor layer 9. As used herein, a surface is "physically exposed" if the surface is in physical contact with vacuum, or a gas phase material (such as air).

The optional semiconductor material layer 10, if present, may be formed on the top surface of the substrate semiconductor layer 9 prior to, or after, formation of the at least one semiconductor device 700 by deposition of a single crystalline semiconductor material, for example, by selective epitaxy. The deposited semiconductor material may be the same as, or may be different from, the semiconductor material of the substrate semiconductor layer 9. The deposited semiconductor material may be any material that may be used for the substrate semiconductor layer 9 as described above. The single crystalline semiconductor material of the semiconductor material layer 10 may be in epitaxial alignment with the single crystalline structure of the substrate semiconductor layer 9. Portions of the deposited semiconductor material located above the top surface of the planarization dielectric layer 770 may be removed, for example, by chemical mechanical planarization (CMP). In this case, the semiconductor material layer 10 may have a top surface that is coplanar with the top surface of the planarization dielectric layer 770.

The region (i.e., area) of the at least one semiconductor device 700 is herein referred to as a peripheral device region 200. The region in which a memory array may be subsequently formed is herein referred to as a memory array region 100. A staircase region 300 for subsequently forming stepped terraces of electrically conductive layers may be provided between the memory array region 100 and the peripheral device region 200.

Figure 2:
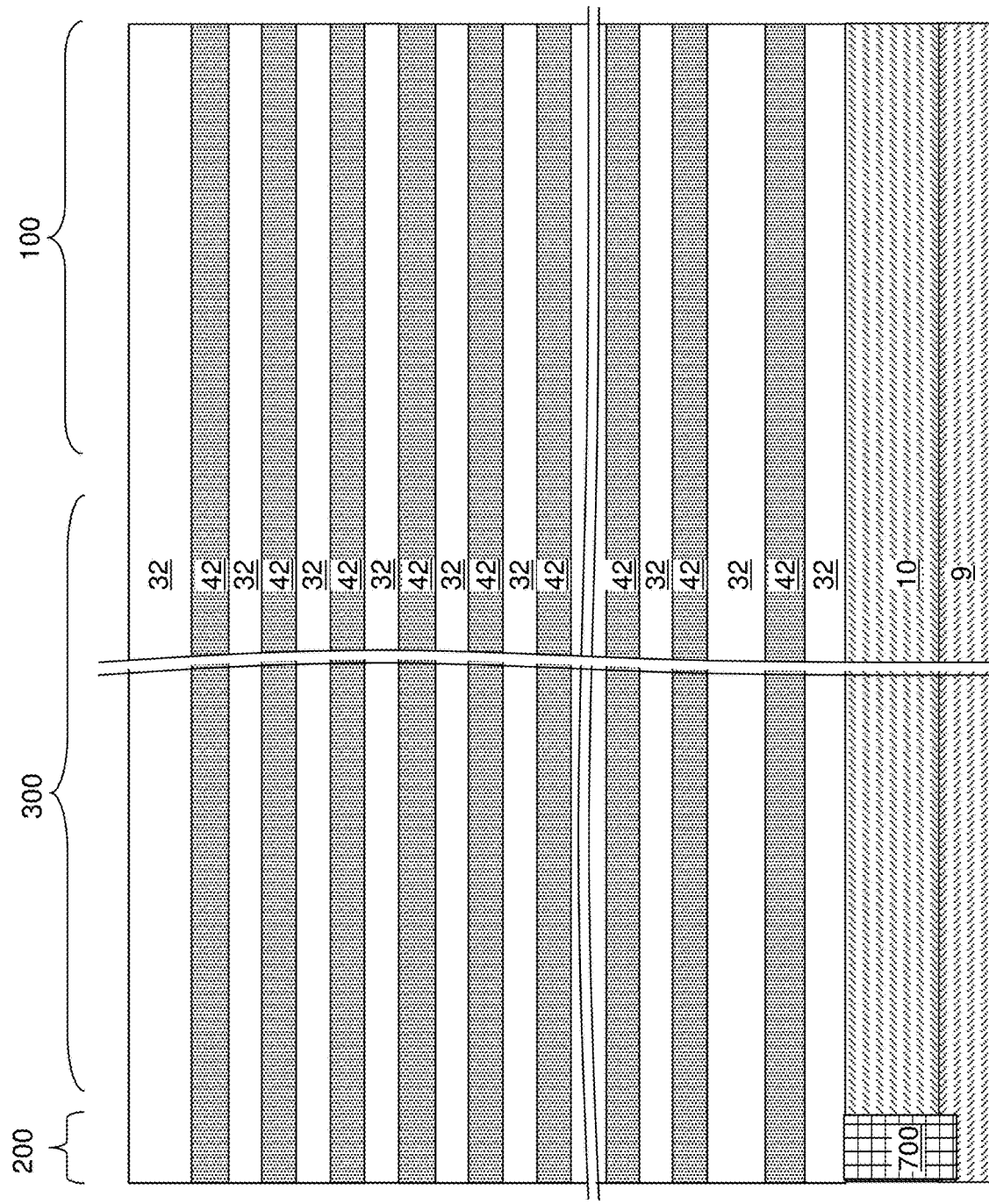
FIG. 2 is a schematic vertical cross-sectional view of the exemplary structure after formation of an alternating stack of insulating layers and sacrificial material layers according to an embodiment of the present disclosure.

Referring to FIG. 2, a stack of an alternating plurality of first material layers (which may be insulating layers 32) and second material layers (which may be sacrificial material layer 42) may be formed over the top surface of the substrate (9, 10). As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality may be adjoined by two instances of the second elements on both sides, and each instance of the second elements that is not an end element of the alternating plurality is adjoined by two instances of the first elements on both ends. The first elements may have the same thickness throughout, or may have different thicknesses. The second elements may have the same thickness throughout, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer may be an insulating layer 32, and each second material layer may be a sacrificial material layer. In this case, the stack may include an alternating plurality of insulating layers 32 and sacrificial material layers 42, and constitute a prototype stack of alternating layers comprising insulating layers 32 and sacrificial material layers 42.

The stack of the alternating plurality is herein referred to as an alternating stack (32, 42). In one embodiment, the alternating stack (32, 42) may include insulating layers 32 composed of the first material, and sacrificial material layers 42 composed of a second material different from that of insulating layers 32. The first material of the insulating layers 32 may be at least one insulating material. As such, each insulating layer 32 may be an insulating material layer. Insulating materials that may be used for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 may be silicon oxide.

The second material of the sacrificial material layers 42 may be a sacrificial material that is removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 may be subsequently replaced with electrically conductive electrodes which may function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 may be spacer material layers that comprise silicon nitride or a semiconductor material including at least one of silicon and germanium.

In one embodiment, the insulating layers 32 may include silicon oxide, and sacrificial material layers may include silicon nitride sacrificial material layers. The first material of the insulating layers 32 may be deposited, for example, by chemical vapor deposition (CVD). For example, if silicon oxide is used for the insulating layers 32, tetraethyl orthosilicate (TEOS) may be used as the precursor material for the CVD process. The second material of the sacrificial material layers 42 may be formed, for example, CVD or atomic layer deposition (ALD).

The sacrificial material layers 42 may be suitably patterned so that conductive material portions to be subsequently formed by replacement of the sacrificial material layers 42 may function as electrically conductive electrodes, such as the control gate electrodes of the monolithic three-dimensional NAND string memory devices to be subsequently formed. The sacrificial material layers 42 may comprise a portion having a strip shape extending substantially parallel to the major surface 7 of the substrate.

The thicknesses of the insulating layers 32 and the sacrificial material layers 42 may be in a range from 20 nm to 50 nm, although lesser and greater thicknesses may be used for each insulating layer 32 and for each sacrificial material layer 42. The number of repetitions of the pairs of an insulating layer 32 and a sacrificial material layer (e.g., a control gate electrode or a sacrificial material layer) 42 may be in a range from 2 to 1,024, and typically from 8 to 256, although a greater number of repetitions may also be used. The top and bottom gate electrodes in the stack may function as the select gate electrodes. In one embodiment, each sacrificial material layer 42 in the alternating stack (32, 42) may have a uniform thickness that is substantially constant within each respective sacrificial material layer 42.

While the present disclosure is described using an embodiment in which the spacer material layers are sacrificial material layers 42 that are subsequently replaced with electrically conductive layers, embodiments are expressly contemplated herein in which the sacrificial material layers are formed as electrically conductive layers. In this case, steps for replacing the spacer material layers with electrically conductive layers may be omitted. In one embodiment, the topmost insulating layer 32 may have a greater thickness than each of the underlying insulating layers 32.

Figure 3:
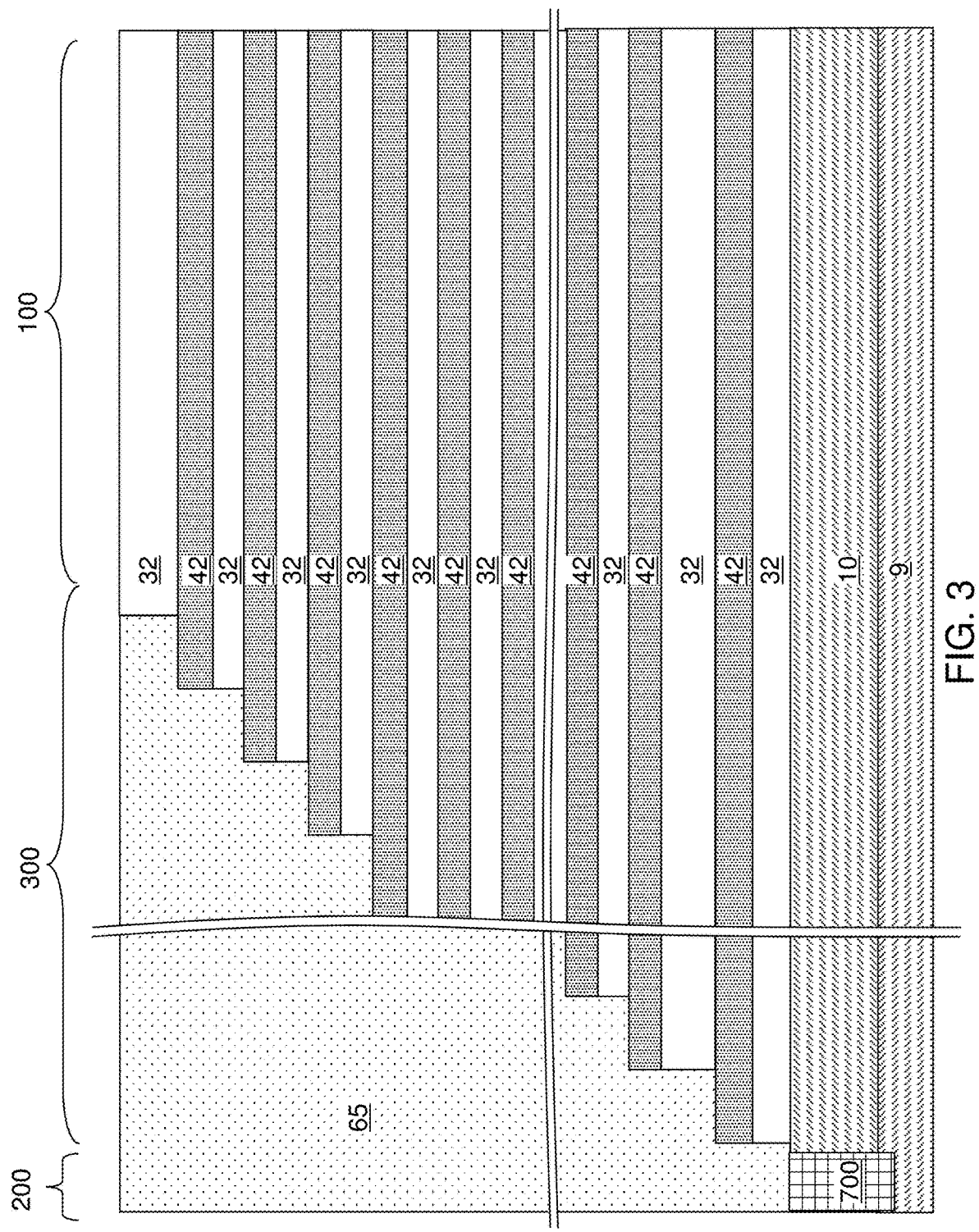
FIG. 3 is a schematic vertical cross-sectional view of the exemplary structure after formation of stepped terraces and a retro-stepped dielectric material portion according to an embodiment of the present disclosure.

Referring to FIG. 3, stepped surfaces may be formed at a peripheral region of the alternating stack (32, 42), which is herein referred to as a terrace region. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A stepped cavity may be formed within the volume from which portions of the alternating stack (32, 42) are removed through formation of the stepped surfaces. A "stepped cavity" refers to a cavity having stepped surfaces.

The terrace region may be formed in the staircase region 300, which is located between the memory array region 100 and the peripheral device region 200 containing the at least one semiconductor device 700 for the peripheral circuitry. The stepped cavity may have various stepped surfaces such that the horizontal cross-sectional shape of the stepped cavity changes in steps as a function of the vertical distance from the top surface of the substrate (9, 10). In one embodiment, the stepped cavity may be formed by repetitively performing a set of processing steps. The set of processing steps may include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

Each sacrificial material layer 42 other than a topmost sacrificial material layer 42 within the alternating stack (32, 42) laterally extends farther than any overlying sacrificial material layer 42 within the alternating stack (32, 42) in the terrace region. The terrace region includes stepped surfaces of the alternating stack (32, 42) that extend from a bottommost layer within the alternating stack (32, 42) to a topmost layer within the alternating stack (32, 42).

Each vertical step of the stepped surfaces may have the height of one or more pairs of an insulating layer 32 and a sacrificial material layer 42. In one embodiment, each vertical step may have the height of a single pair of an insulating layer 32 and a sacrificial material layer 42. In another embodiment, multiple "columns" of staircases may be formed along a first horizontal direction hd1 such that each vertical step has the height of a plurality of pairs of an insulating layer 32 and a sacrificial material layer 42, and the number of columns may be at least the number of the plurality of pairs. Each column of staircase may be vertically offset from one another such that each of the sacrificial material layers 42 has a physically exposed top surface in a respective column of staircases. In the illustrative example, two columns of staircases may be formed for each block of memory stack structures to be subsequently formed such that one column of staircases provide physically exposed top surfaces for odd-numbered sacrificial material layers 42 (as counted from the bottom) and another column of staircases provide physically exposed top surfaces for even-numbered sacrificial material layers (as counted from the bottom). Configurations using three, four, or more columns of staircases with a respective set of vertical offsets from the physically exposed surfaces of the sacrificial material layers 42 may also be used. Each sacrificial material layer 42 may have a greater lateral extent, at least along one direction, than any overlying sacrificial material layers 42 such that each physically exposed surface of any sacrificial material layer 42 does not have an overhang. In one embodiment, the vertical steps within each column of staircases may be arranged along the first horizontal direction hd1, and the columns of staircases may be arranged along a second horizontal direction hd2 that is perpendicular to the first horizontal direction hd1. In one embodiment, the first horizontal direction hd1 may be perpendicular to the boundary between the memory array region 100 and the staircase region 300.

A retro-stepped dielectric material portion 65 (i.e., an insulating fill material portion) may be formed in the stepped cavity by deposition of a dielectric material therein. For example, a dielectric material such as silicon oxide may be deposited in the stepped cavity. Excess portions of the deposited dielectric material may be removed from above the top surface of the topmost insulating layer 32, for example, by chemical mechanical planarization (CMP). The remaining portion of the deposited dielectric material filling the stepped cavity may constitute the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is used for the retro-stepped dielectric material portion 65, the silicon oxide of the retro-stepped dielectric material portion 65 may, or may not, be doped with dopants such as B, P, and/or F.

Optionally, drain select level isolation structures 72 may be formed through the topmost insulating layer 32 and a subset of the sacrificial material layers 42 located at drain select levels. The drain select level isolation structures 72 may be formed, for example, by forming drain select level isolation trenches and filling the drain select level isolation trenches with a dielectric material such as silicon oxide. Excess portions of the dielectric material may be removed from above the top surface of the topmost insulating layer 32.

Figure 4A:
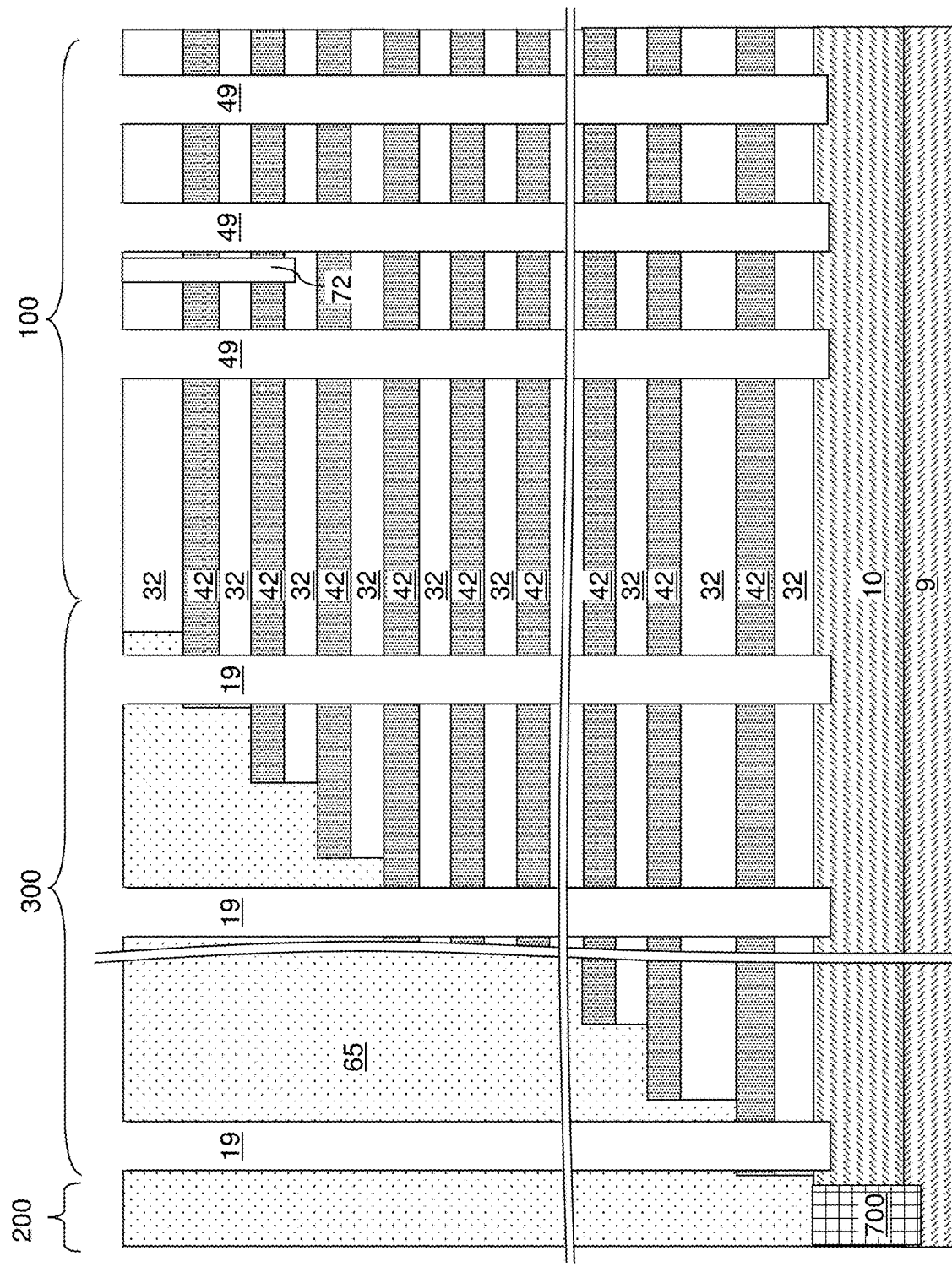
FIG. 4A is a schematic vertical cross-sectional view of the exemplary structure after formation of memory openings and support openings according to an embodiment of the present disclosure.
Figure 4B:
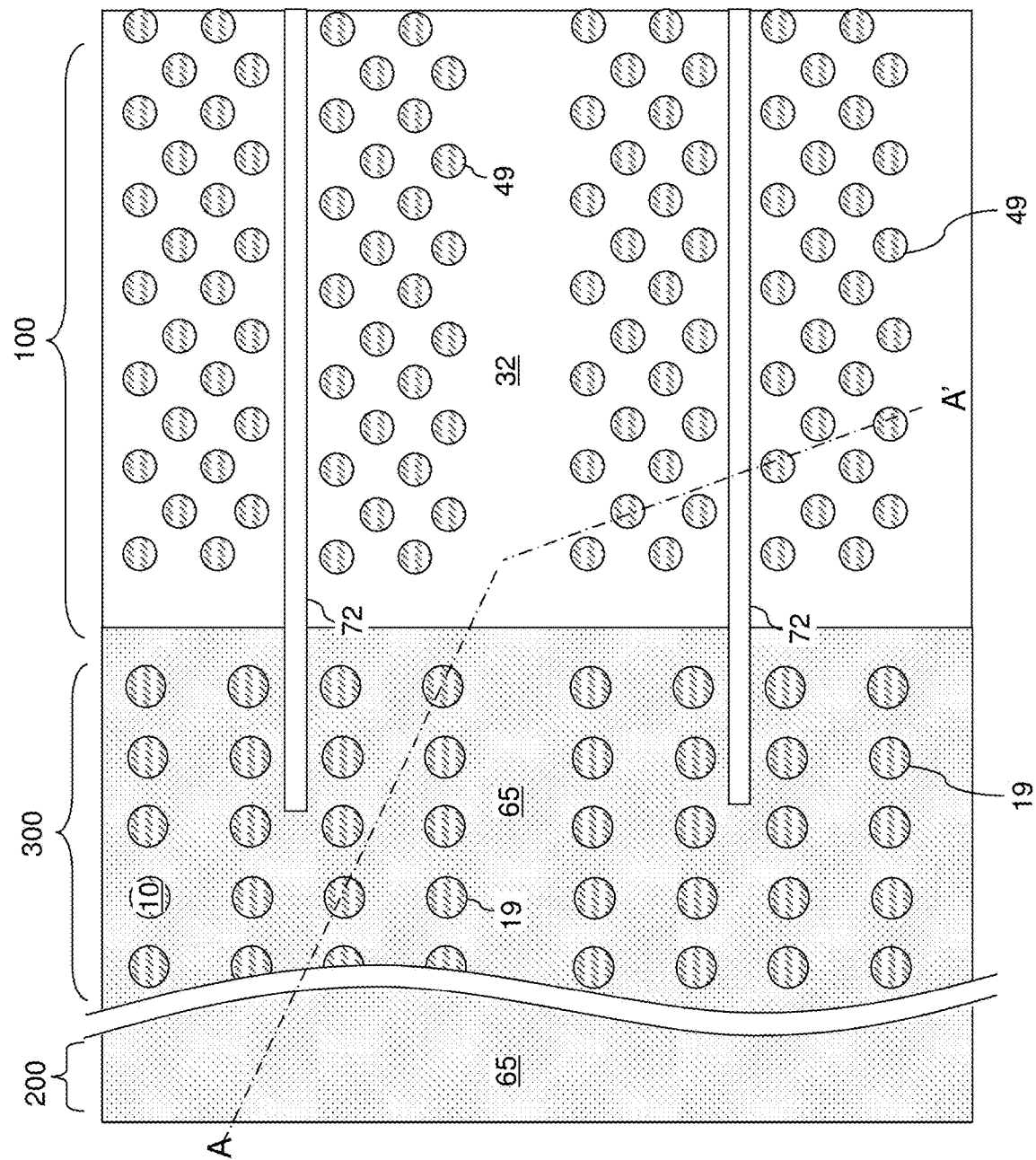
FIG. 4B is a top-down view of the exemplary structure of FIG. 4A. The vertical plane A-A' is the plane of the cross-section for FIG. 4A.

Referring to FIGS. 4A and 4B, a lithographic material stack (not shown) including at least a photoresist layer may be formed over the topmost insulating layer 32 and the retro-stepped dielectric material portion 65, and may be lithographically patterned to form openings therein. The openings may include a first set of openings formed over the memory array region 100 and a second set of openings formed over the staircase region 300. The pattern in the lithographic material stack may be transferred through the topmost insulating layer 32 or the retro-stepped dielectric material portion 65, and through the alternating stack (32, 42) by at least one anisotropic etch that uses the patterned lithographic material stack as an etch mask. Portions of the alternating stack (32, 42) underlying the openings in the patterned lithographic material stack may be etched to form memory openings 49 and support openings 19. As used herein, a "memory opening" refers to a structure in which memory cells, such as a memory stack structure, may be subsequently formed. As used herein, a "support opening" refers to a structure in which a support structure (such as a support pillar structure) that mechanically supports other elements is subsequently formed. The memory openings 49 may be formed through the topmost insulating layer 32 and the entirety of the alternating stack (32, 42) in the memory array region 100. The support openings 19 may be formed through the retro-stepped dielectric material portion 65 and the portion of the alternating stack (32, 42) that underlie the stepped surfaces in the staircase region 300.

The memory openings 49 may extend through the entirety of the alternating stack (32, 42). The support openings 19 may extend through a subset of layers within the alternating stack (32, 42). The chemistry of the anisotropic etch process used to etch through the materials of the alternating stack (32, 42) may alternate to optimize etching of the first and second materials in the alternating stack (32, 42). The anisotropic etch may be, for example, a series of reactive ion etches. The sidewalls of the memory openings 49 and the support openings 19 may be substantially vertical, or may be tapered. The patterned lithographic material stack may be subsequently removed, for example, by ashing.

The memory openings 49 and the support openings 19 may extend from the top surface of the alternating stack (32, 42) to at least the horizontal plane including the topmost surface of the semiconductor material layer 10. In one embodiment, an overetch into the semiconductor material layer 10 may be optionally performed after the top surface of the semiconductor material layer 10 is physically exposed at a bottom of each memory opening 49 and each support opening 19. The overetch may be performed prior to, or after, removal of the lithographic material stack. In other words, the recessed surfaces of the semiconductor material layer 10 may be vertically offset from the un-recessed top surfaces of the semiconductor material layer 10 by a recess depth. The recess depth may be, for example, in a range from 1 nm to 50 nm, although lesser and greater recess depths may also be used. The overetch is optional, and may be omitted. If the overetch is not performed, the bottom surfaces of the memory openings 49 and the support openings 19 may be coplanar with the topmost surface of the semiconductor material layer 10.

Each of the memory openings 49 and the support openings 19 may include a sidewall (or a plurality of sidewalls) that extends substantially perpendicular to the topmost surface of the substrate. A two-dimensional array of memory openings 49 may be formed in the memory array region 100. A two-dimensional array of support openings 19 may be formed in the staircase region 300. The substrate semiconductor layer 9 and the semiconductor material layer 10 collectively constitutes a substrate (9, 10), which may be a semiconductor substrate. Alternatively, the semiconductor material layer 10 may be omitted, and the memory openings 49 and the support openings 19 may be extend to a top surface of the substrate semiconductor layer 9.

FIGS. 5A-5H illustrate structural changes during formation of a first memory opening fill structure in a memory opening 49, which is one of the memory openings 49 in the exemplary structure of FIGS. 4A and 4B. The same structural change may occur simultaneously in each of the other memory openings 49 and in each of the support openings 19.

Figure 5B:
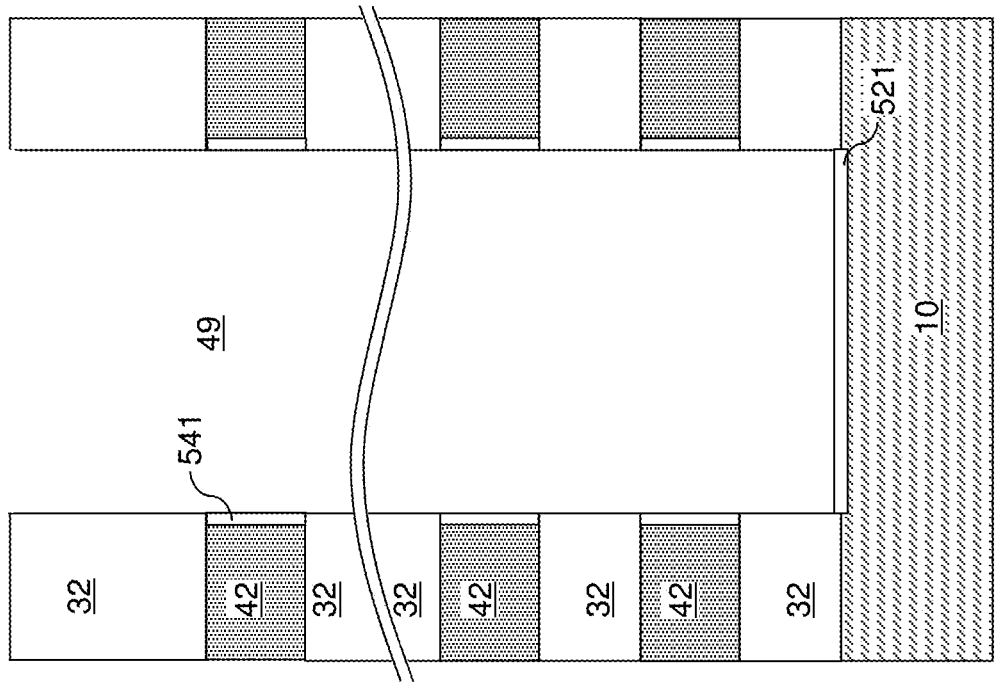
Figure 5A:
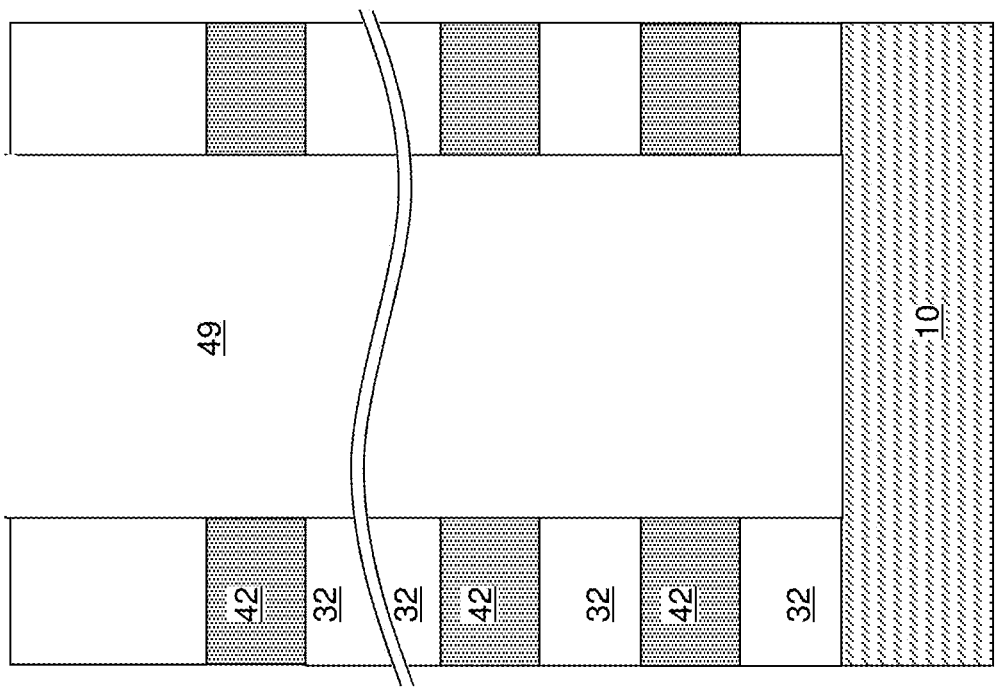

Referring to FIG. 5A, a memory opening 49 in the exemplary device structure of FIGS. 4A and 4B is illustrated. The memory opening 49 may extend through the topmost insulating layer 32, the alternating stack (32, 42), and optionally into an upper portion of the semiconductor material layer 10. At this processing step, each support opening 19 may extend through the retro-stepped dielectric material portion 65, a subset of layers in the alternating stack (32, 42), and optionally through the upper portion of the semiconductor material layer 10. The recess depth of the bottom surface of each memory opening 49 with respect to the top surface of the semiconductor material layer 10 may be in a range from 0 nm to 30 nm, although greater recess depths may also be used. Optionally, the sacrificial material layers 42 may be laterally recessed partially to form lateral recess regions (not shown), for example, by an isotropic etch.

Referring to FIG. 5B, an optional oxidation process may be performed to convert surface portions of the sacrificial material layers 42 (or electrically conductive layers in case the spacer material layers are formed as electrically conductive layers) into dielectric oxide portions, which are herein referred to as barrier dielectric portions 541. In one embodiment, the sacrificial material layers 42 may comprise silicon nitride, and the barrier dielectric portions 541 may comprise silicon oxide portions and/or silicon oxynitride portions having a lateral nitrogen concentration gradient such that atomic concentration of nitrogen decreases with a lateral distance from an interface between each sacrificial material layer 42 and the barrier dielectric portions 541. The lateral thickness of the barrier dielectric portions 541 may be in a range from 2 nm to 10 nm, although lesser and greater thicknesses may also be used. Each of the barrier dielectric portions 541 may have a tubular shape. An optional barrier dielectric spacer 521 may be formed on each physically exposed surface of the semiconductor material layer 10, for example, by oxidation of a respective surface portion of the semiconductor material layer 10. The barrier dielectric portions 541 and the barrier dielectric spacer 521 are optional and may be omitted entirely or be present temporarily and then be removed during subsequent processing steps.

Figure 5D:
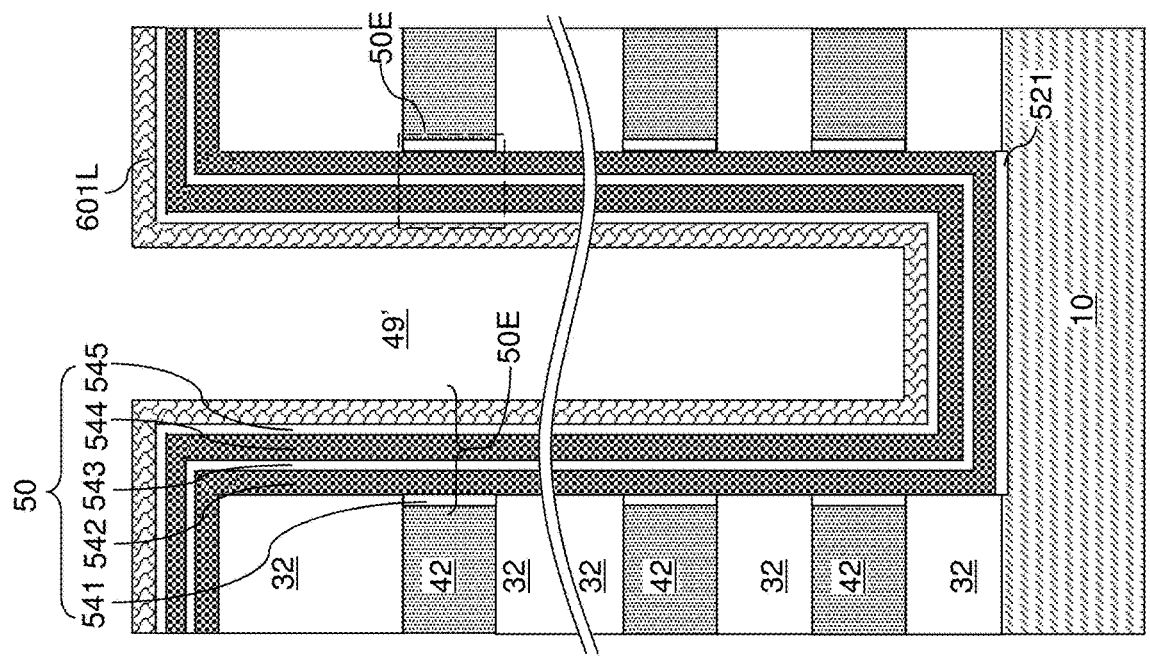
Figure 5C:
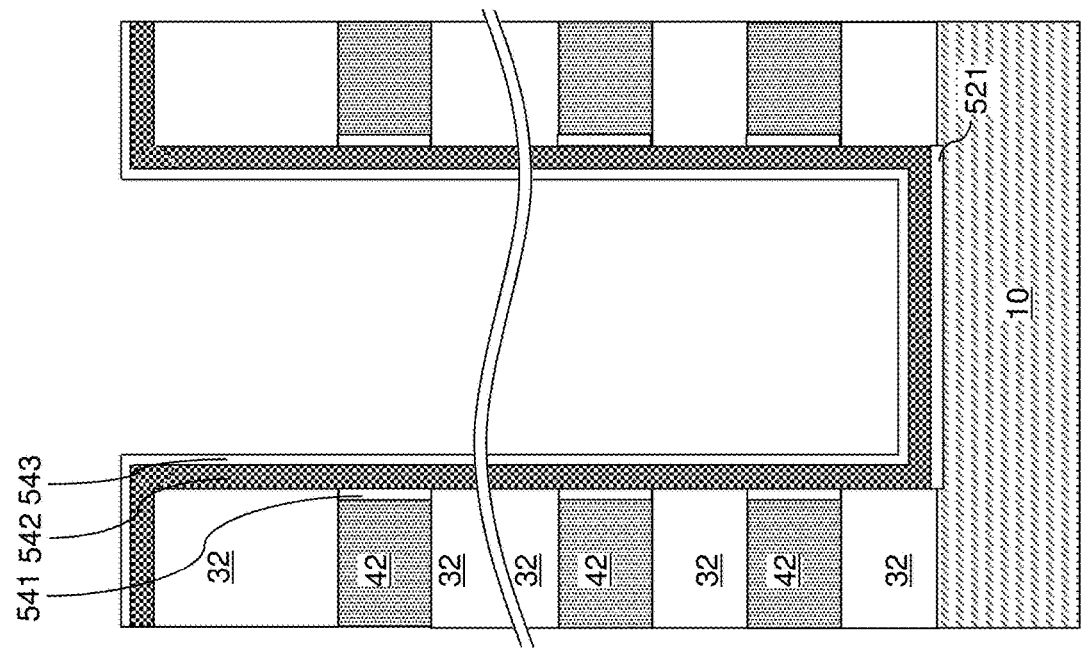

Referring to FIG. 5C, a first ferroelectric material layer 542 may be formed on inner sidewalls of the barrier dielectric portions 541 (or on the sacrificial material layers 42 if the barrier dielectric portions are omitted) and physically exposed surfaces of the insulating layers 32. The first ferroelectric material layer 542 may vertically extend as a continuous material layer from a bottommost one of the insulating layers 32 to a topmost one of the insulating layers 32, and directly contacts sidewalls of each of the insulating layers 32. The first ferroelectric material layer 542 may include first ferroelectric material portions that contact a respective one of the barrier dielectric portions 541 at each level of the sacrificial material layers 42. Each first ferroelectric material portion may be a portion of the first ferroelectric material layer 542 that is a continuous material layer.

The first ferroelectric material layer 542 includes a ferroelectric material. As used herein, a "ferroelectric material" refers to a crystalline material that exhibits spontaneous electrical polarization in the absence of an external electric field. The ferroelectric material in the first ferroelectric material layer 542 may be an insulating ferroelectric material or a semiconducting ferroelectric material. In one embodiment, the first ferroelectric material layer 542 comprises an orthorhombic phase hafnium oxide layer including at least one dopant selected from Al, Zr or Si. Other suitable ferroelectric materials may also be used, such as titanate ferroelectric materials (e.g., barium titanate, lead titanate, lead zirconate titanate, lead lanthanum zirconate titanate ("PLZT"), etc.). The first ferroelectric material layer 542 may have a thickness in a range from 1.5 nm to 15 nm, such as from 3 nm to 10 nm, although lesser and greater thicknesses may also be used. In one embodiment, the first ferroelectric material layer 542 may be deposited by a conformal deposition process such as chemical vapor deposition (CVD) or atomic layer deposition (ALD).

Referring to FIG. 5D, a continuous dielectric material layer may be formed by a conformal deposition process. The continuous dielectric material layer is herein referred to as an inter-ferroelectric dielectric layer 543 because a second ferroelectric material layer 544 may be subsequently formed on the inter-ferroelectric dielectric layer 543, thereby positioning the inter-ferroelectric dielectric layer 543 between two ferroelectric material portions. The inter-ferroelectric dielectric layer 543 maybe a continuous dielectric material layer having a thickness in a range from 0.3 nm to 2.0 nm, such as from 0.4 nm to 1.0 nm. The inter-ferroelectric dielectric layer 543 may include a dielectric material such as silicon oxide, silicon nitride, or dielectric metal oxide such as aluminum oxide. Preferably, the inter-ferroelectric dielectric layer 543 comprises a non-ferroelectric material which does not exhibit ferroelectric properties. In one embodiment, the inter-ferroelectric dielectric layer 543 comprises, and/or consists essentially of, silicon oxide.

The second ferroelectric material layer 544 may be deposited by a conformal deposition process. The second ferroelectric material layer 544 may include any ferroelectric material that may be used for the first ferroelectric material layer 542. The second ferroelectric material layer 544 may have a thickness in a range from 1.5 nm to 15 nm, such as from 3 nm to 10 nm, although lesser and greater thicknesses may also be used.

A gate dielectric layer 545 may be formed as a continuous material layer on the second ferroelectric material layer 544. The gate dielectric layer 545 may include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the gate dielectric layer 545 may include a stack of a first silicon oxide layer, a silicon oxynitride layer, and a second silicon oxide layer, which is commonly known as an ONO stack. In one embodiment, the gate dielectric layer 545 may include a silicon oxide layer that is substantially free of carbon or a silicon oxynitride layer that is substantially free of carbon. The thickness of the gate dielectric layer 545 may be in a range from 2 nm to 20 nm, although lesser and greater thicknesses may also be used.

A layer stack including a vertical stack of the barrier dielectric portions 541, the first ferroelectric material layer 542, the inter-ferroelectric dielectric layer 543, the second ferroelectric material layer 544, and the gate dielectric layer 545 constitutes a memory film 50. Each portion of the memory film 50 within a memory opening 49 comprises a vertical stack of ferroelectric memory cells 50E that are located at each level of the spacer material layers such as the sacrificial material layers 42. Each ferroelectric memory cell 50E includes a layer stack including, from one side to another, a barrier dielectric portion 541, a first ferroelectric material portion that is portion of the first ferroelectric material layer 542, an inter-ferroelectric dielectric portion that is a portion of the inter-ferroelectric dielectric layer 543, a second ferroelectric material portion that is portion of the second ferroelectric material layer 544, and a gate dielectric portion that is a portion of the gate dielectric layer 545. A gate dielectric portion is provided on each ferroelectric memory cell 50E. Each of the gate dielectric portions comprises a respective portion of the gate dielectric layer 545 that vertically extends from a bottommost one of the insulating layers 32 to a topmost one of the insulating layers 32.

A first semiconductor channel material layer 601L may be formed on the gate dielectric layer 545. The first semiconductor channel material layer 601L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channel material layer 601L includes amorphous silicon or polysilicon. The first semiconductor channel material layer 601L may be formed by a conformal deposition method such as low pressure chemical vapor deposition (LPCVD). The thickness of the first semiconductor channel material layer 601L may be in a range from 2 nm to 10 nm, although lesser and greater thicknesses may also be used. A memory cavity 49' may be present in the volume of each memory opening 49 that is not filled with the deposited material layers.

Referring to FIG. 5E, the first semiconductor channel material layer 601L, the gate dielectric layer 545, the second ferroelectric material layer 544, the inter-ferroelectric dielectric layer 543, and the first ferroelectric material layer 542 may be sequentially anisotropically etched using at least one anisotropic etch process. The portions of the first semiconductor channel material layer 601L, the gate dielectric layer 545, the second ferroelectric material layer 544, the inter-ferroelectric dielectric layer 543, and the first ferroelectric material layer 542 located above the top surface of the topmost insulating layer 32 may be removed by the at least one anisotropic etch process. Further, the horizontal portions of the first semiconductor channel material layer 601L, the gate dielectric layer 545, the second ferroelectric material layer 544, the inter-ferroelectric dielectric layer 543, and the first ferroelectric material layer 542 at a bottom of each memory cavity 49' may be removed to form openings in remaining portions thereof. Each of the first semiconductor channel material layer 601L, the gate dielectric layer 545, the second ferroelectric material layer 544, the inter-ferroelectric dielectric layer 543, and the first ferroelectric material layer 542 may be etched by a respective anisotropic etch process using a respective etch chemistry, which may, or may not, be the same for the various material layers.

Each remaining portion of the first semiconductor channel material layer 601L may have a tubular configuration, and is herein referred to as a first semiconductor channel layer 601. A center portion of each barrier dielectric spacer 521 may be etched through to provide a physically exposed top surface of the semiconductor material layer 10.

Referring to FIG. 5F, a second semiconductor channel material layer 602L may be deposited directly on the semiconductor surface of the semiconductor material layer 10, and directly on the first semiconductor channel layer 601. The second semiconductor channel material layer 602L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the second semiconductor channel material layer 602L includes amorphous silicon or polysilicon. The second semiconductor channel material layer 602L may be formed by a conformal deposition method such as low pressure chemical vapor deposition (LPCVD). The thickness of the second semiconductor channel material layer 602L may be in a range from 2 nm to 10 nm, although lesser and greater thicknesses may also be used. The second semiconductor channel material layer 602L may partially fill the memory cavity 49' in each memory opening, or may fully fill the cavity in each memory opening. The materials of the first semiconductor channel layer 601 and the second semiconductor channel material layer 602L are collectively referred to as a semiconductor channel material.

A dielectric material such as silicon oxide may be deposited to fill the memory cavity 49'. The deposited dielectric material forms a dielectric core layer 62L. The dielectric core layer 62L may be deposited by a conformal deposition method such as low pressure chemical vapor deposition (LPCVD), or by a self-planarizing deposition process such as spin coating.

Figure 5H:
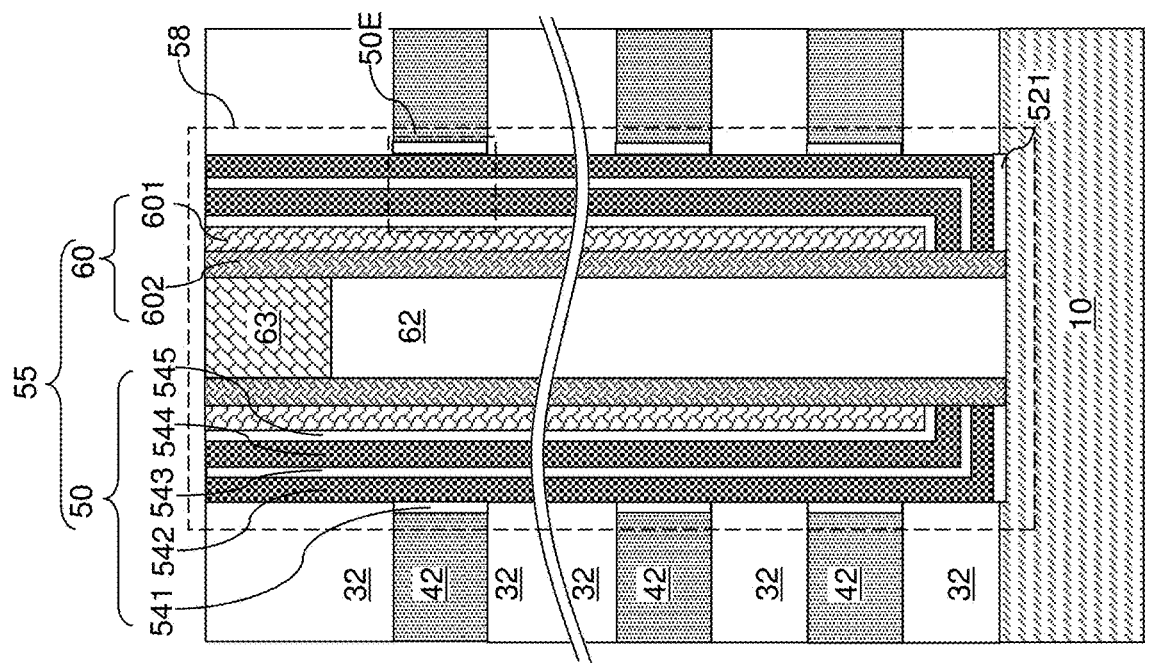
Figure 5G:
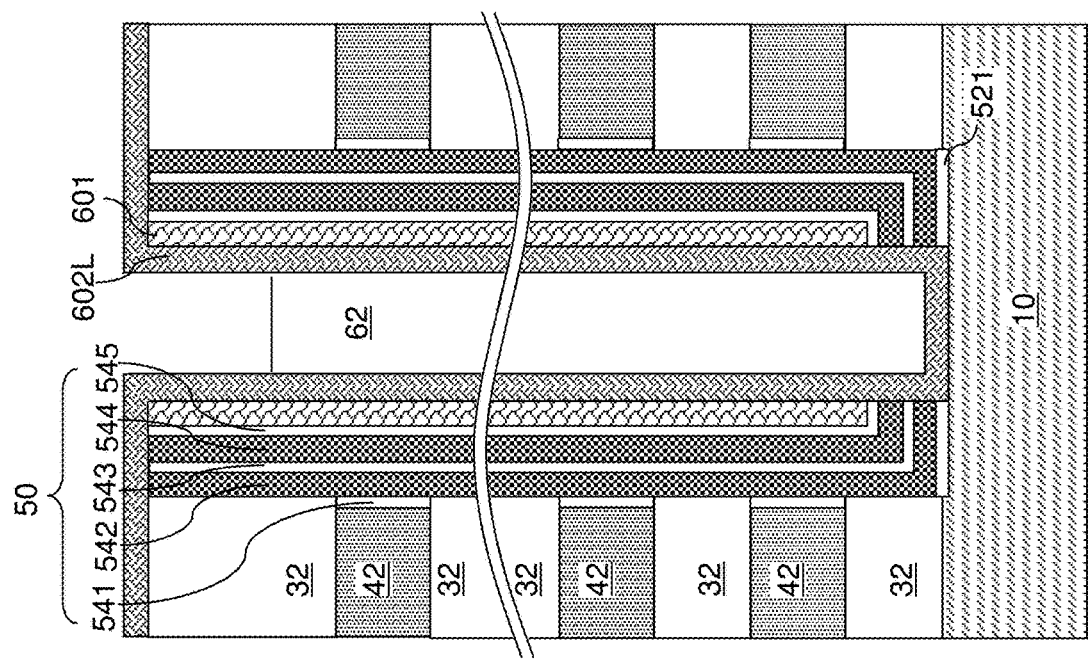

Referring to FIG. 5G, the horizontal portion of the dielectric core layer 62L may be recessed, for example, by a recess etch from above the top surface of the topmost insulating layer 32. The recess etch process may be continued until recessed surfaces of remaining portions of the dielectric core layer 62L are formed between a horizontal plane including a bottom surface of the topmost insulating layer 32 and a horizontal plane including a top surface of the topmost insulating layer 32. Each remaining portion of the dielectric core layer 62L constitutes a dielectric core 62.

Referring to FIG. 5H, the horizontal portion of the second semiconductor channel material layer 602L overlying the topmost insulating layer 32 may be removed by a recess process such as a recess etch process. Each remaining portion of the second semiconductor channel material layer 602L may be located entirety within a memory opening 49 or entirely within a support opening 19. Each remaining portion of the second semiconductor channel material layer 602L is herein referred to as a second semiconductor channel layer 602.

Each adjoining pair of a first semiconductor channel layer 601 and a second semiconductor channel layer 602 may collectively form a vertical semiconductor channel 60 through which electrical current may flow when a vertical NAND device including the vertical semiconductor channel 60 is turned on. Each combination of a memory film 50 and a vertical semiconductor channel 60 constitutes a memory stack structure 55.

Drain regions 63 may be formed by depositing a doped semiconductor material within each recessed region above the dielectric cores 62. The drain regions 63 may have a doping of a second conductivity type that is the opposite of the first conductivity type. For example, if the first conductivity type is p-type, the second conductivity type is n-type, and vice versa. The dopant concentration in the drain regions 63 may be in a range from $5.0 \times 10^{19}/cm^3$ to $2.0 \times 10^{21}/cm^3$, although lesser and greater dopant concentrations may also be used. The doped semiconductor material may be, for example, doped polysilicon. Excess portions of the deposited semiconductor material may be removed from above the top surface of the topmost insulating layer 32, for example, by chemical mechanical planarization (CMP) or a recess etch to form the drain regions 63.

The set of all components filling a memory opening 49 is herein referred to as a memory opening fill structure 58, which may include a memory stack structure 55, a dielectric core 62, a drain region 63, and a barrier dielectric spacer 521. The set of all components filling a support opening 19 is herein referred to as a support pillar structure. Generally, a memory film 50 may be formed in each memory opening 49. The memory film 50 comprises a vertical stack of ferroelectric memory cells 50E that are located at each level of the spacer material layers such as sacrificial material layers 42.

FIGS. 6A-6L illustrate structural changes during formation of a first exemplary memory opening fill structure in a memory opening 49, which is one of the memory openings 49 in the exemplary structure of FIGS. 4A and 4B. The same structural change may occur simultaneously in each of the other memory openings 49 and in each of the support openings 19.

Figure 6B:
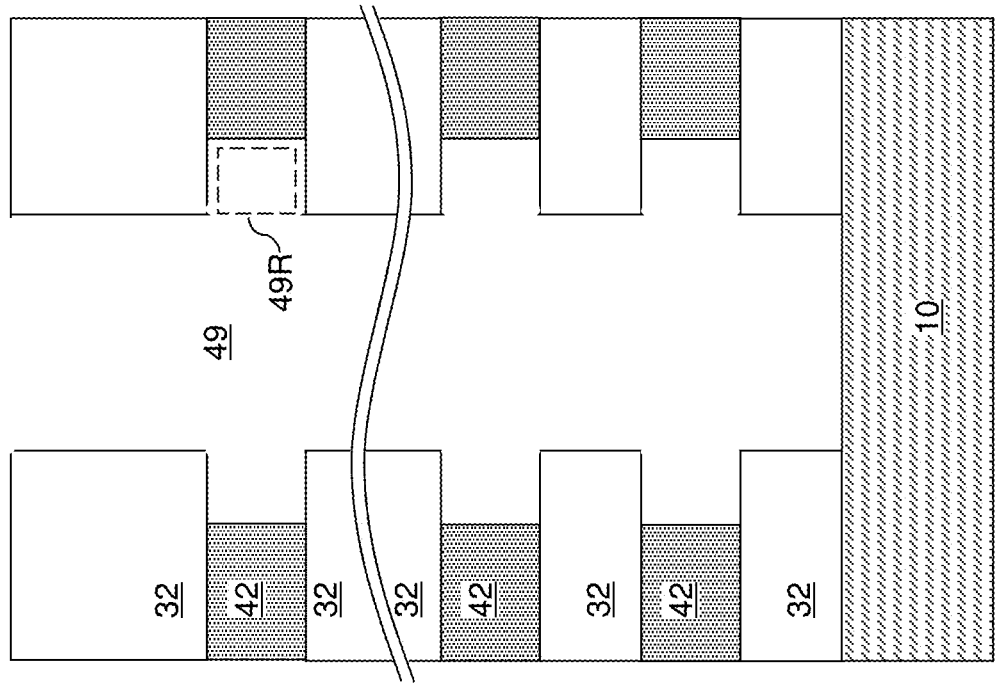
Figure 6A:
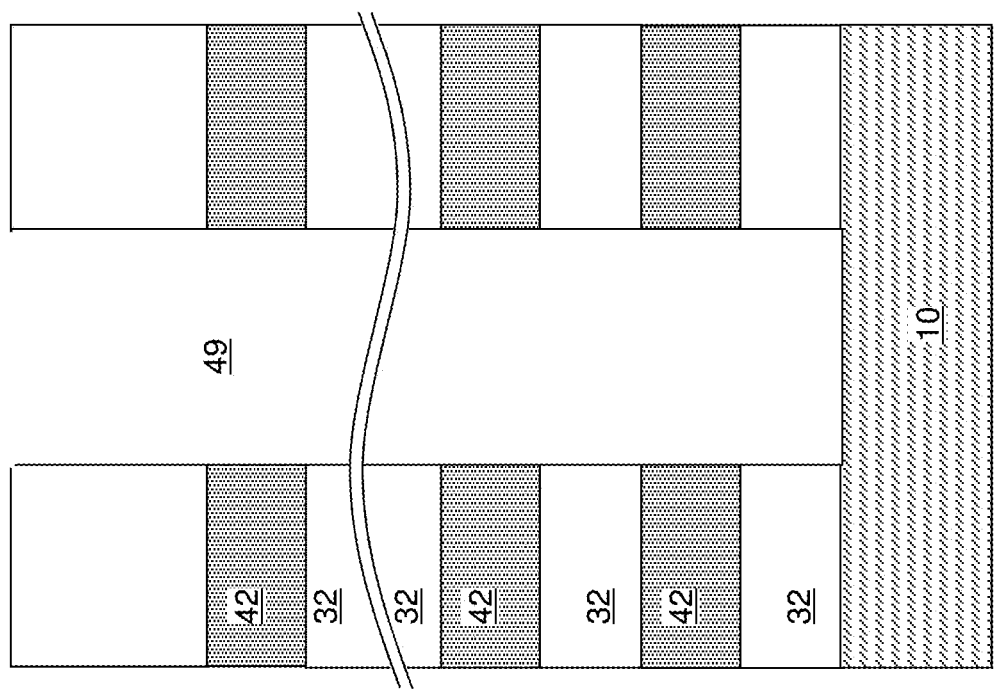

Referring to FIG. 6A, a memory opening 49 in the exemplary device structure of FIGS. 4A and 4B is illustrated. The memory opening 49 may extend through the topmost insulating layer 32, the alternating stack (32, 42), and optionally into an upper portion of the semiconductor material layer 10. At this processing step, each support opening 19 may extend through the retro-stepped dielectric material portion 65, a subset of layers in the alternating stack (32, 42), and optionally through the upper portion of the semiconductor material layer 10. The recess depth of the bottom surface of each memory opening with respect to the top surface of the semiconductor material layer 10 may be in a range from 0 nm to 30 nm, although greater recess depths may also be used. Optionally, the sacrificial material layers 42 may be laterally recessed partially to form lateral recess regions (not shown), for example, by an isotropic etch.

Referring to FIG. 6B, an isotropic etch process such as a wet etch process may be performed to laterally recess the spacer material layers (such as the sacrificial material layers 42) selective to the insulating layers 32. For example, if the sacrificial material layers 42 include silicon nitride, a wet etch process using a mixture of hydrofluoric acid and glycerol. The memory opening 49 may be expanded in volume at levels of the sacrificial material layers 42 to include lateral recess regions 49R, which are annular cavities adjoined to the void of the memory opening 49 as provided at the processing steps of FIG. 6A. The lateral recess region distance of the isotropic etch process may be in a range from 10 nm to 100 nm, although lesser and greater lateral recess region distances may also be used.

Referring to FIG. 6C, an optional oxidation process may be performed to convert surface portions of the sacrificial material layers 42 (or electrically conductive layers in case the spacer material layers are formed as electrically conductive layers) into dielectric oxide portions, which are herein referred to as barrier dielectric portions 551. Each of the optional barrier dielectric portions may be within a respective lateral recess region 49R formed by laterally recessing the spacer material layers (such as sacrificial material layers 42).

In one embodiment, the sacrificial material layers 42 may comprise silicon nitride, and the barrier dielectric portions 551 may comprise silicon oxide portions and/or silicon oxynitride portions having a lateral nitrogen concentration gradient such that atomic concentration of nitrogen decreases with a lateral distance from an interface between each sacrificial material layer 42 and the barrier dielectric portions 551. The lateral thickness of the barrier dielectric portions 551 may be in a range from 2 nm to 10 nm, although lesser and greater thicknesses may also be used. Each of the barrier dielectric portions 551 may have a tubular shape. An optional barrier dielectric spacer 521 may be formed on each physically exposed surface of the semiconductor material layer 10, for example, by oxidation of a respective surface portion of the semiconductor material layer 10.

Referring to FIG. 6D, a first ferroelectric material layer 552L is formed on inner sidewalls of the barrier dielectric portions 551 (or on the sacrificial material layers 42 if the barrier dielectric portions 551 are omitted) and physically exposed surfaces of the insulating layers 32. The first ferroelectric material layer 552L vertically extends as a continuous material layer from a bottommost one of the insulating layers 32 to a topmost one of the insulating layers 32, and directly contacts sidewalls of each of the insulating layers 32. The first ferroelectric material layer 552L includes a ferroelectric material. The ferroelectric material in the first ferroelectric material layer 552L may be an insulating ferroelectric material or a semiconducting ferroelectric material. In one embodiment, the first ferroelectric material layer 552L comprises a hafnium oxide layer including at least one dopant selected from Al, Zr, and Si and having a thickness in a range from 1.5 nm to 60 nm, such as from 3 nm to 30 nm, although lesser and greater thicknesses may also be used. In one embodiment, the first ferroelectric material layer 552L may be deposited by a conformal deposition process such as chemical vapor deposition (CVD) or atomic layer deposition (ALD). The thickness of the first ferroelectric material layer 552L may be greater than, the same as, or less than one half of the thickness of each sacrificial material layer 42. In one embodiment, the thickness of the first ferroelectric material layer 552L may be greater than one half of the thickness of the thickest sacrificial material layer 42, and the entire volumes of the lateral recess regions 49R may be filled with the first ferroelectric material layer 552L.

Referring to FIG. 6E, an anisotropic etch process may be performed to remove portions of the first ferroelectric material layer 552L located outside the volumes of the lateral recess regions 49R in each memory opening 49. The barrier dielectric spacer 521 may be collaterally removed from the bottom of each memory opening 49. Further, remaining portions of the first ferroelectric material layer 552L may be optionally laterally recessed to provide an optimal thickness to each remaining annular portion of the first ferroelectric material layer 552L. Each remaining annular potion of the first ferroelectric material layer 552L is herein referred to as first ferroelectric material portions 552. Each ferroelectric material portion 552 contacts contact a respective one of the barrier dielectric portions 551 at each level of the sacrificial material layers 42. Each first ferroelectric material portion 552 may be a discrete annular material portion that includes the first ferroelectric material layer 42. Each first ferroelectric material portion 552 may have a lateral thickness in a range from 1.5 nm to 15 nm, such as from 3 nm to 10 nm, although lesser and greater lateral thicknesses may also be used. In one embodiment, each of the first ferroelectric material portions 552 has a respective tubular shape, and is formed within a respective one of the lateral recess regions 49R.

Referring to FIG. 6F, a continuous dielectric material layer is formed by a conformal deposition process. The continuous dielectric material layer is herein referred to as an inter-ferroelectric dielectric layer 553L because a second ferroelectric material layer 554L may be subsequently formed on the inter-ferroelectric dielectric layer 553L, thereby positioning the inter-ferroelectric dielectric layer 553L between two ferroelectric material portions. The inter-ferroelectric dielectric layer 553L is a continuous dielectric material layer having a thickness in a range from 0.3 nm to 2.0 nm, such as from 0.4 nm to 1.0 nm. The inter-ferroelectric dielectric layer 553L includes a dielectric material such as silicon oxide, silicon nitride, or dielectric metal oxide such as aluminum oxide. In one embodiment, the inter-ferroelectric dielectric layer 553L comprises, and/or consists essentially of, silicon oxide. In one embodiment, the inter-ferroelectric dielectric layer 553L may contact sidewall surfaces of the insulating layers 32, annular bottom surfaces of the insulating layers 32, annular top surfaces of the insulating layers, a top surface of the semiconductor material layer 10, and a top surface of the topmost insulating layer 32.

The second ferroelectric material layer 554L may be deposited by a conformal deposition process. The second ferroelectric material layer 554L may include any ferroelectric material that may be used for the first ferroelectric material portions 552. The second ferroelectric material layer 554L may have a thickness in a range from 1.5 nm to 60 nm, such as from 3 nm to 30 nm, although lesser and greater thicknesses may also be used.

Figure 6H:
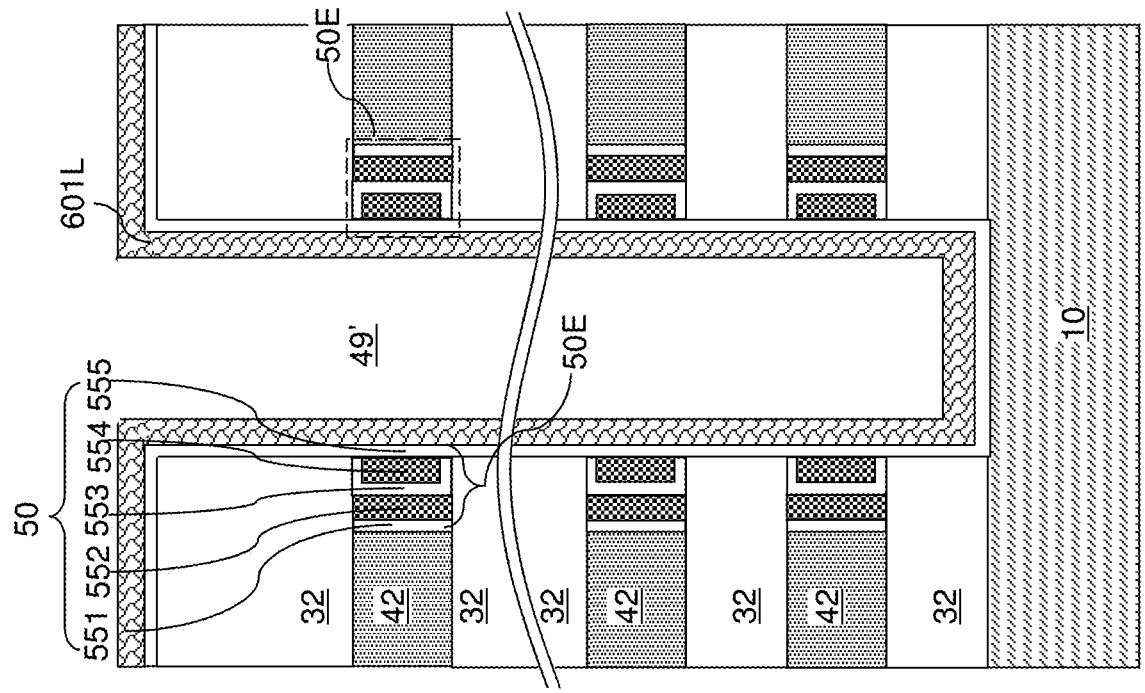
Figure 6G:
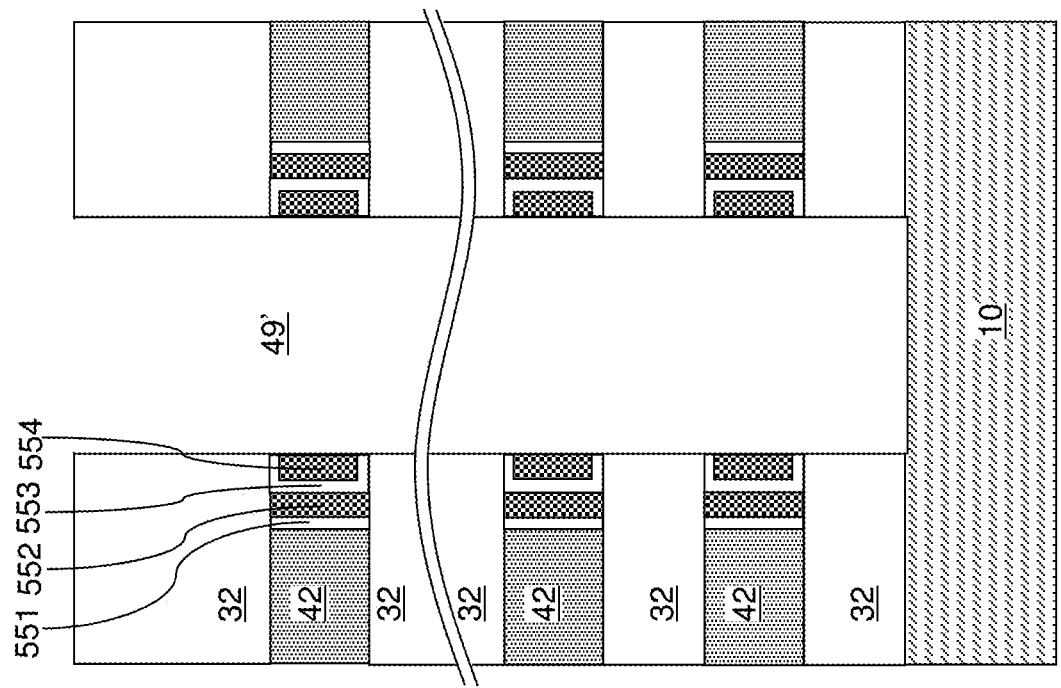

Referring to FIG. 6G, portions of the second ferroelectric material layer 554L and the inter-ferroelectric dielectric layer 553L located outside of the lateral recess regions 49R may be removed by an anisotropic etch process. Each remaining tubular portion of the inter-ferroelectric dielectric layer 553L constitutes an inter-ferroelectric dielectric portion 553, and each remaining portion of the second ferroelectric material layer 554L constitutes a second ferroelectric material potion 554. In one embodiment, each inter-ferroelectric dielectric portion 553 may have a clam-shaped vertical cross-sectional shape. Each inter-ferroelectric dielectric portion 553 may include a tubular portion including an inner vertical sidewall and an outer vertical sidewall, an upper annular portion, and a lower annular portion. Each second ferroelectric material portion 554 may have a tubular shape. In one embodiment, the second dielectric material potions 554 and the inter-ferroelectric dielectric portions 553 may have inner sidewalls that are vertically coincident with sidewalls of the insulating layers 32. Each second dielectric material portion 554 may have a lateral thickness in a range from 1.5 nm to 15 nm, such as from 3 nm to 10 nm, although lesser and greater lateral thicknesses may also be used.

Referring to FIG. 6H, a gate dielectric layer 555 may be formed as a continuous material layer on the second ferroelectric material portions 554, the inter-ferroelectric dielectric portions 553, and the insulating layers 32. The thickness of the gate dielectric layer 555 may be in a range from 2 nm to 20 nm, although lesser and greater thicknesses may also be used.

A layer stack including a vertical stack of the barrier dielectric portions 551, the first ferroelectric material portions 552, the inter-ferroelectric dielectric portions 553, the second ferroelectric material portions 554, and the gate dielectric layer 555 constitutes a memory film 50. Each portion of the memory film 50 within a memory opening 49 comprises a vertical stack of ferroelectric memory cells 50E that are located at each level of the spacer material layers such as the sacrificial material layers 42. Each ferroelectric memory cell 50E includes a layer stack including, from one side to another, a barrier dielectric portion 551, a first ferroelectric material portion 552, an inter-ferroelectric dielectric portion 553, a second ferroelectric material 554, and a gate dielectric portion that is a portion of the gate dielectric layer 555. A gate dielectric portion is provided on each ferroelectric memory cell 50E. Each of the gate dielectric portions comprises a respective portion of the gate dielectric layer 555 that vertically extends from a bottom-most one of the insulating layers 32 to a topmost one of the insulating layers 32.

A first semiconductor channel material layer 601L may be formed on the gate dielectric layer 555. The first semiconductor channel material layer 601L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channel material layer 601L includes amorphous silicon or polysilicon. The first semiconductor channel material layer 601L may be formed by a conformal deposition method such as low pressure chemical vapor deposition (LPCVD). The thickness of the first semiconductor channel material layer 601L may be in a range from 2 nm to 10 nm, although lesser and greater thicknesses may also be used. A memory cavity 49' may be present in the volume of each memory opening 49 that is not filled with the deposited material layers.

Figure 6J:
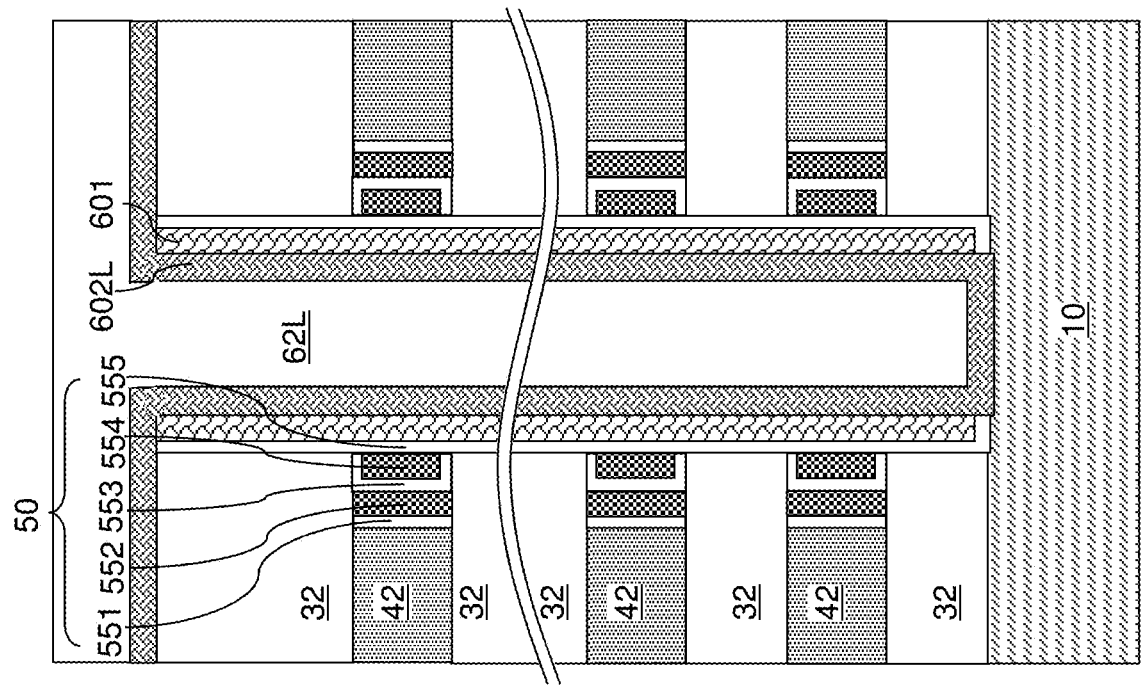
Figure 6I:
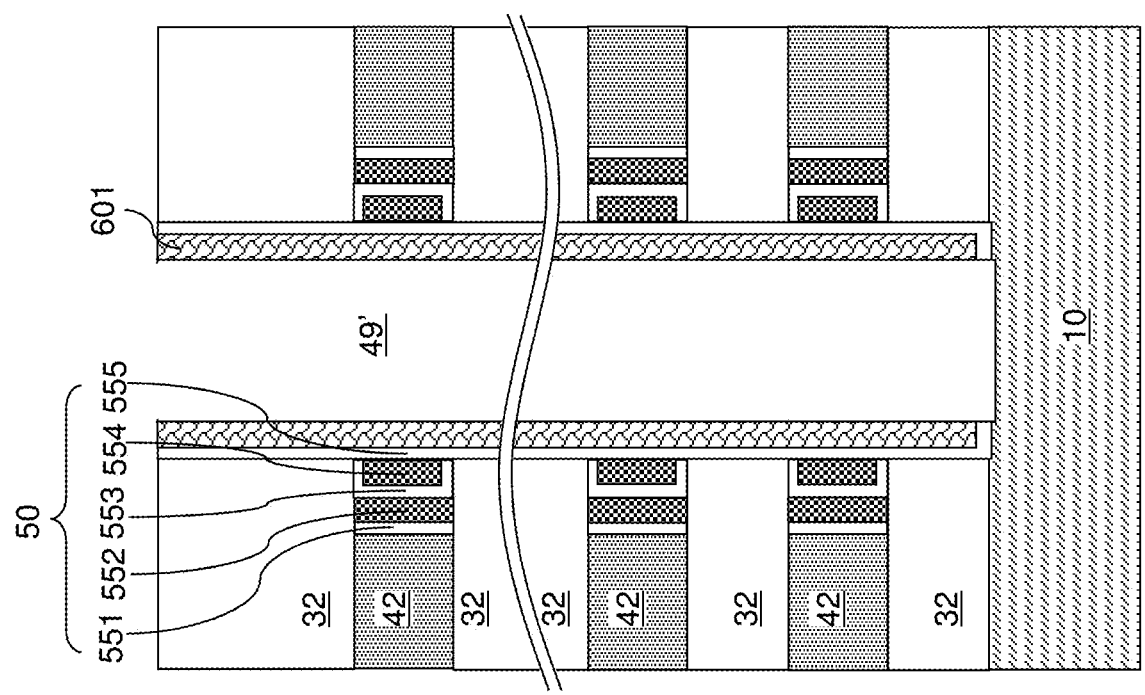

Referring to FIG. 6I, the first semiconductor channel material layer 601L and the gate dielectric layer 555 are sequentially anisotropically etched using at least one anisotropic etch process. The portions of the first semiconductor channel material layer 601 and the gate dielectric layer 555 located above the top surface of the topmost insulating layer 32 may be removed by the at least one anisotropic etch process. Further, the horizontal portions of the first semiconductor channel material layer 601L and the gate dielectric layer 555 at a bottom of each memory cavity 49' may be removed to form openings in remaining portions thereof. Each of the first semiconductor channel material layer 601L and the gate dielectric layer 555 may be etched by a respective anisotropic etch process using a respective etch chemistry, which may, or may not, be the same for the various material layers.

Each remaining portion of the first semiconductor channel material layer 601L may have a tubular configuration, and is herein referred to as a first semiconductor channel layer 601.

A top surface of the semiconductor material layer 10 may be physically exposed at the bottom of each memory cavity 49'.

Referring to FIG. 6J, a second semiconductor channel material layer 602L may be deposited directly on the semiconductor surface of the semiconductor material layer 10, and directly on the first semiconductor channel layer 601. The second semiconductor channel material layer 602L includes a semiconductor material such as at least one elemental semiconductor material, at least one III-V compound semiconductor material, at least one II-VI compound semiconductor material, at least one organic semiconductor material, or other semiconductor materials known in the art.

In one embodiment, the second semiconductor channel material layer 602L includes amorphous silicon or polysilicon. The second semiconductor channel material layer 602L may be formed by a conformal deposition method such as low pressure chemical vapor deposition (LPCVD). The thickness of the second semiconductor channel material layer 602L may be in a range from 2 nm to 10 nm, although lesser and greater thicknesses may also be used. The second semiconductor channel material layer 602L may partially fill the memory cavity 49' in each memory opening, or may fully fill the cavity in each memory opening. The materials of the first semiconductor channel layer 601 and the second semiconductor channel material layer 602L are collectively referred to as a semiconductor channel material.

A dielectric material such as silicon oxide may be deposited to fill the memory cavity 49'. The deposited dielectric material forms a dielectric core layer 62L. The dielectric core layer 62L may be deposited by a conformal deposition method such as low pressure chemical vapor deposition (LPCVD), or by a self-planarizing deposition process such as spin coating.

Referring to FIG. 6K, the horizontal portion of the dielectric core layer 62L may be recessed, for example, by a recess etch from above the top surface of the topmost insulating layer 32. The recess etch process may be continued until recessed surfaces of remaining portions of the dielectric core layer 62L may be formed between a horizontal plane including a bottom surface of the topmost insulating layer 32 and a horizontal plane including a top surface of the topmost insulating layer 32. Each remaining portion of the dielectric core layer 62L constitutes a dielectric core 62.

Referring to FIG. 6L, the horizontal portion of the second semiconductor channel material layer 602L overlying the topmost insulating layer 32 may be removed by a recess process such as a recess etch process. Each remaining portion of the second semiconductor channel material layer 602L may be located entirety within a memory opening 49 or entirely within a support opening 19. Each remaining portion of the second semiconductor channel material layer 602L is herein referred to as a second semiconductor channel layer 602.

Each adjoining pair of a first semiconductor channel layer 601 and a second semiconductor channel layer 602 may collectively form a vertical semiconductor channel 60 through which electrical current may flow when a vertical NAND device including the vertical semiconductor channel 60 is turned on. Each combination of a memory film 50 and a vertical semiconductor channel 60 constitutes a memory stack structure 55.

Drain regions 63 may be formed by depositing a doped semiconductor material within each recessed region above the dielectric cores 62. The drain regions 63 may have a doping of a second conductivity type that is the opposite of the first conductivity type. For example, if the first conductivity type is p-type, the second conductivity type is n-type, and vice versa.

The dopant concentration in the drain regions 63 may be in a range from $5.0\times10^{19}/cm^3$ to $2.0\times10^{21}/cm^3$, although lesser and greater dopant concentrations may also be used. The doped semiconductor material may be, for example, doped polysilicon. Excess portions of the deposited semiconductor material may be removed from above the top surface of the topmost insulating layer 32, for example, by chemical mechanical planarization (CMP) or a recess etch to form the drain regions 63.

The set of all components filling a memory opening 49 is herein referred to as a memory opening fill structure 58, which may include a memory stack structure 55, a dielectric core 62, a drain region 63, and a barrier dielectric spacer 521. The set of all components filling a support opening 19 is herein referred to as a support pillar structure. Generally, a memory film 50 is formed in each memory opening 49. The memory film 50 comprises a vertical stack of ferroelectric memory cells 50E that are located at each level of the spacer material layers such as sacrificial material layers 42.

Figure 7:
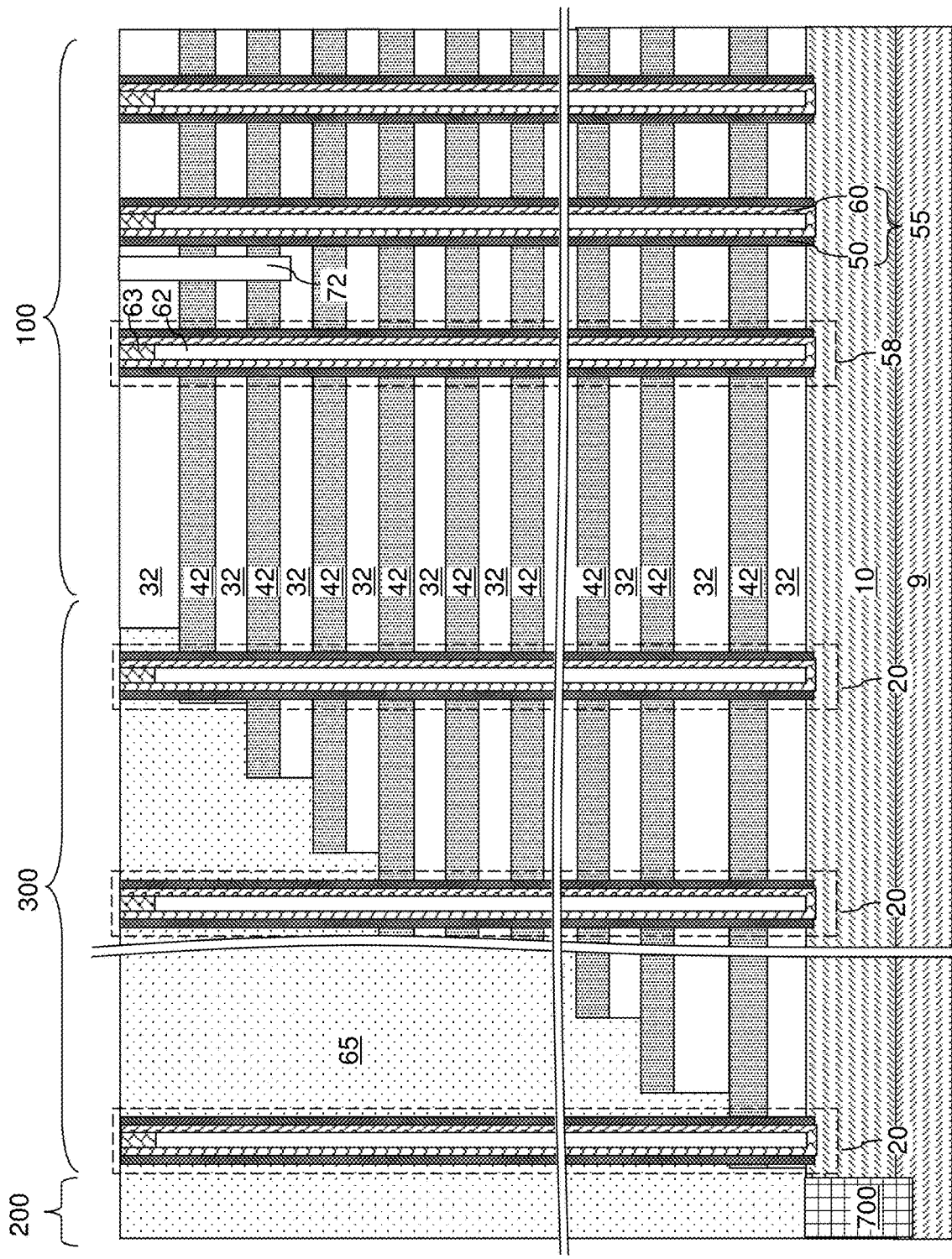
FIG. 7 is a schematic vertical cross-sectional view of the exemplary structure after formation of memory stack structures and support pillar structures according to an embodiment of the present disclosure.

Referring to FIG. 7, the exemplary structure is illustrated after formation of memory opening fill structures 58 and support pillar structure 20 within the memory openings 49 and the support openings 19, respectively. An instance of a memory opening fill structure 58 may be formed within each memory opening 49 of the structure of FIGS. 4A and 4B. An instance of the support pillar structure 20 may be formed within each support opening 19 of the structure of FIGS. 4A and 4B. The memory opening fill structures 58 may be in a first configuration illustrated in FIG. 5H or in a second configuration illustrated in FIG. 6L.

Each memory stack structure 55 includes a vertical semiconductor channel 60, which may comprise multiple semiconductor channel layers (601, 602), and a memory film 50. The memory film 50 may comprise a vertical stack of ferroelectric memory cells 50E (illustrated in FIGS. 5H and 6L).

Figure 8A:
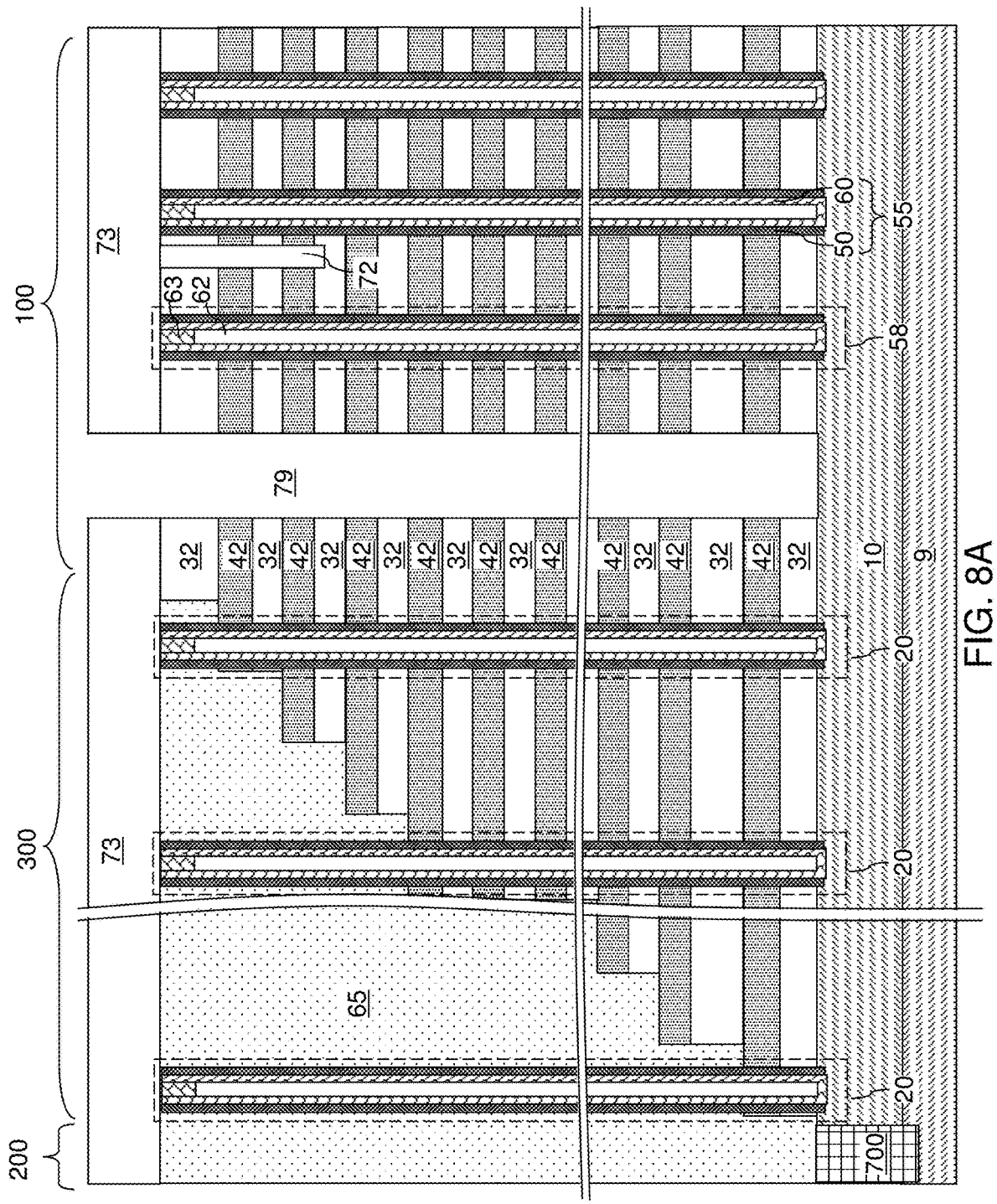
FIG. 8A is a schematic vertical cross-sectional view of the exemplary structure after formation of backside trenches according to an embodiment of the present disclosure.

Referring to FIGS. 8A and 8B, a contact level dielectric layer 73 may be formed over the alternating stack (32, 42) of insulating layer 32 and sacrificial material layers 42, and over the memory stack structures 55 and the support pillar structures 20. The contact level dielectric layer 73 includes a dielectric material that is different from the dielectric material of the sacrificial material layers 42. For example, the contact level dielectric layer 73 may include silicon oxide. The contact level dielectric layer 73 may have a thickness in a range from 50 nm to 500 nm, although lesser and greater thicknesses may also be used.

A photoresist layer (not shown) may be applied over the contact level dielectric layer 73, and is lithographically patterned to form openings in areas between clusters of memory stack structures 55. The pattern in the photoresist layer may be transferred through the contact level dielectric layer 73, the alternating stack (32, 42) and/or the retro-stepped dielectric material portion 65 using an anisotropic etch to form backside trenches 79, which vertically extend from the top surface of the contact level dielectric layer 73 at least to the top surface of the substrate (9, 10), and laterally extend through the memory array region 100 and the staircase region 300.

In one embodiment, the backside trenches 79 may laterally extend along a first horizontal direction hd1 and may be laterally spaced apart from one another along a second horizontal direction hd2 that is perpendicular to the first horizontal direction hd1. The memory stack structures 55 may be arranged in rows that extend along the first horizontal direction hd1. The drain select level isolation structures 72 may laterally extend along the first horizontal direction hd1. Each backside trench 79 may have a uniform width that is invariant along the lengthwise direction (i.e., along the first horizontal direction hd1). Each drain select level isolation structure 72 may have a uniform vertical cross-sectional profile along vertical planes that are perpendicular to the first horizontal direction hd1 that is invariant with translation along the first horizontal direction hd1. Multiple rows of memory stack structures 55 may be located between a neighboring pair of a backside trench 79 and a drain select level isolation structure 72, or between a neighboring pair of drain select level isolation structures 72. In one embodiment, the backside trenches 79 may include a source contact opening in which a source contact via structure may be subsequently formed. The photoresist layer may be removed, for example, by ashing.

Figure 9:
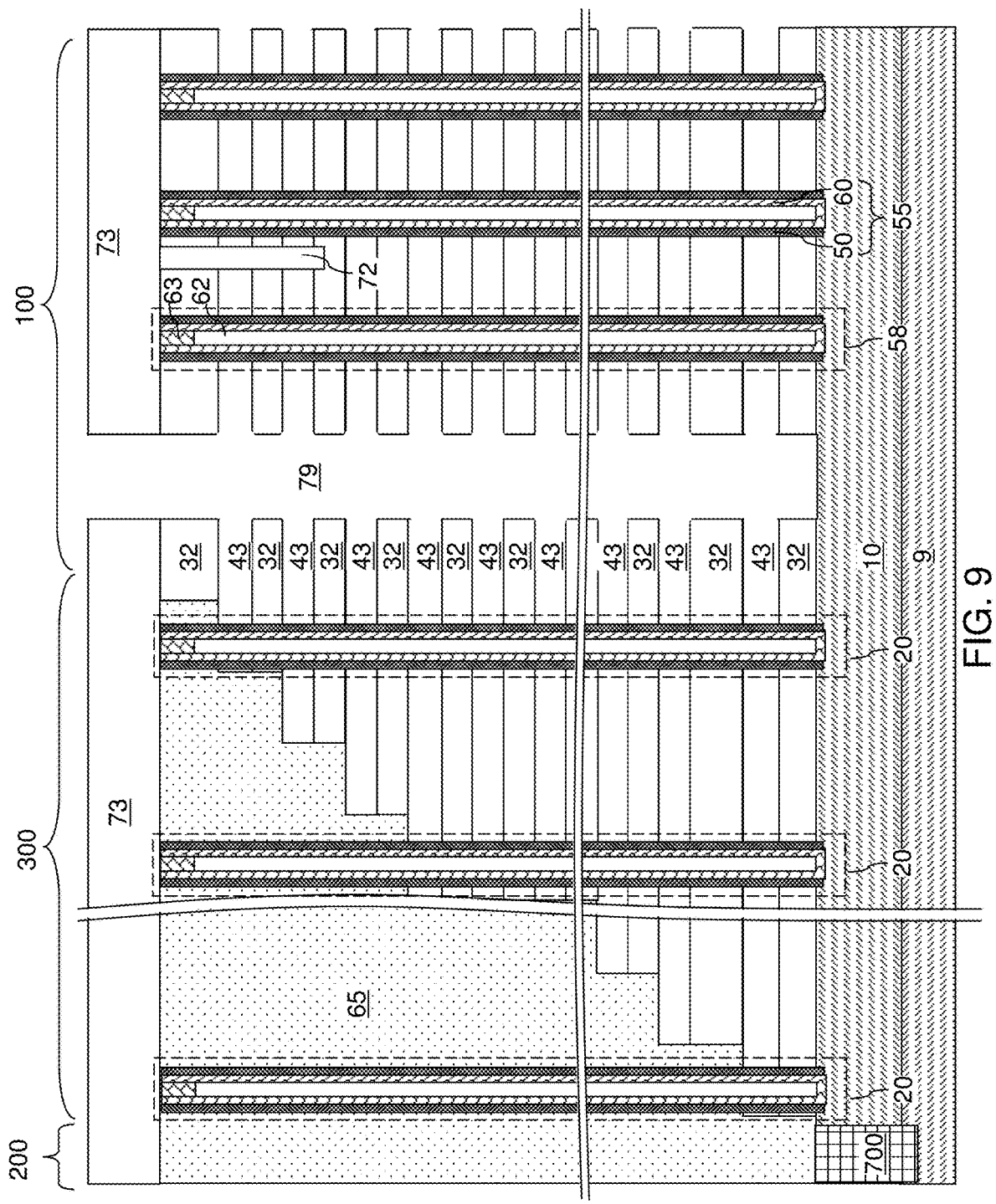
FIG. 9 is a schematic vertical cross-sectional view of the exemplary structure after formation of backside recesses according to an embodiment of the present disclosure.

Referring to FIGS. 9, 10A, and 11A, an etchant that selectively etches the second material of the sacrificial material layers 42 with respect to the first material of the insulating layers 32 may be introduced into the backside trenches 79, for example, using an etch process. FIG. 10A illustrates a region of the exemplary structure of FIG. 8 when the memory opening fill structures 58 are in the first configuration. FIG. 11A illustrates a region of the exemplary structure of FIG. 8 when the memory opening fill structures 58 are in the second configuration. Backside recesses 43 may be formed in volumes from which the sacrificial material layers 42 are removed. The removal of the second material of the sacrificial material layers 42 may be selective to the first material of the insulating layers 32, the material of the retro-stepped dielectric material portion 65, the semiconductor material of the semiconductor material layer 10, and the material of the outermost layer of the memory films 50. In one embodiment, the sacrificial material layers 42 may include silicon nitride, and the materials of the insulating layers 32 and the retro-stepped dielectric material portion 65 may be selected from silicon oxide and dielectric metal oxides. In one embodiment, the etch chemistry of the etch process that removes the sacrificial material layers 42 may be selective to the sacrificial material layers 42 compared to the materials of the barrier dielectric portions (541, 551) such that the barrier dielectric portions (541, 551) are retained in the completed device. In an alternative embodiment, the barrier dielectric portions (541, 551) are removed partially or completely during the etching of the sacrificial material layers 42. In another alternative embodiment, the barrier dielectric portions (541, 551) are omitted entirely and are not formed during the prior steps.

The etch process that removes the second material selective to the first material and the outermost layer of the memory films 50 may be a wet etch process using a wet etch solution, or may be a gas phase (dry) etch process in which the etchant is introduced in a vapor phase into the backside trenches 79. For example, if the sacrificial material layers 42 include silicon nitride, the etch process may be a wet etch process in which the exemplary structure is immersed within a wet etch tank including phosphoric acid, which etches silicon nitride selective to silicon oxide, silicon, and various other materials used in the art. The support pillar structure 20, the retro-stepped dielectric material portion 65, and the memory stack structures 55 provide structural support while the backside recesses 43 are present within volumes previously occupied by the sacrificial material layers 42.

Each backside recess 43 may be a laterally extending cavity having a lateral dimension that is greater than the vertical extent of the cavity. In other words, the lateral dimension of each backside recess 43 may be greater than the height of the backside recess 43. A plurality of backside recesses 43 may be formed in the volumes from which the second material of the sacrificial material layers 42 is removed. The memory openings in which the memory stack structures 55 are formed are herein referred to as front side openings or front side cavities in contrast with the backside recesses 43. In one embodiment, the memory array region 100 comprises an array of monolithic three-dimensional NAND strings having a plurality of device levels disposed above the substrate (9, 10). In this case, each backside recess 43 may define a space for receiving a respective word line of the array of monolithic three-dimensional NAND strings.

Each of the plurality of backside recesses 43 may extend substantially parallel to the top surface of the substrate (9, 10). A backside recess 43 may be vertically bounded by a top surface of an underlying insulating layer 32 and a bottom surface of an overlying insulating layer 32. In one embodiment, each backside recess 43 may have a uniform height throughout.

Figure 12:
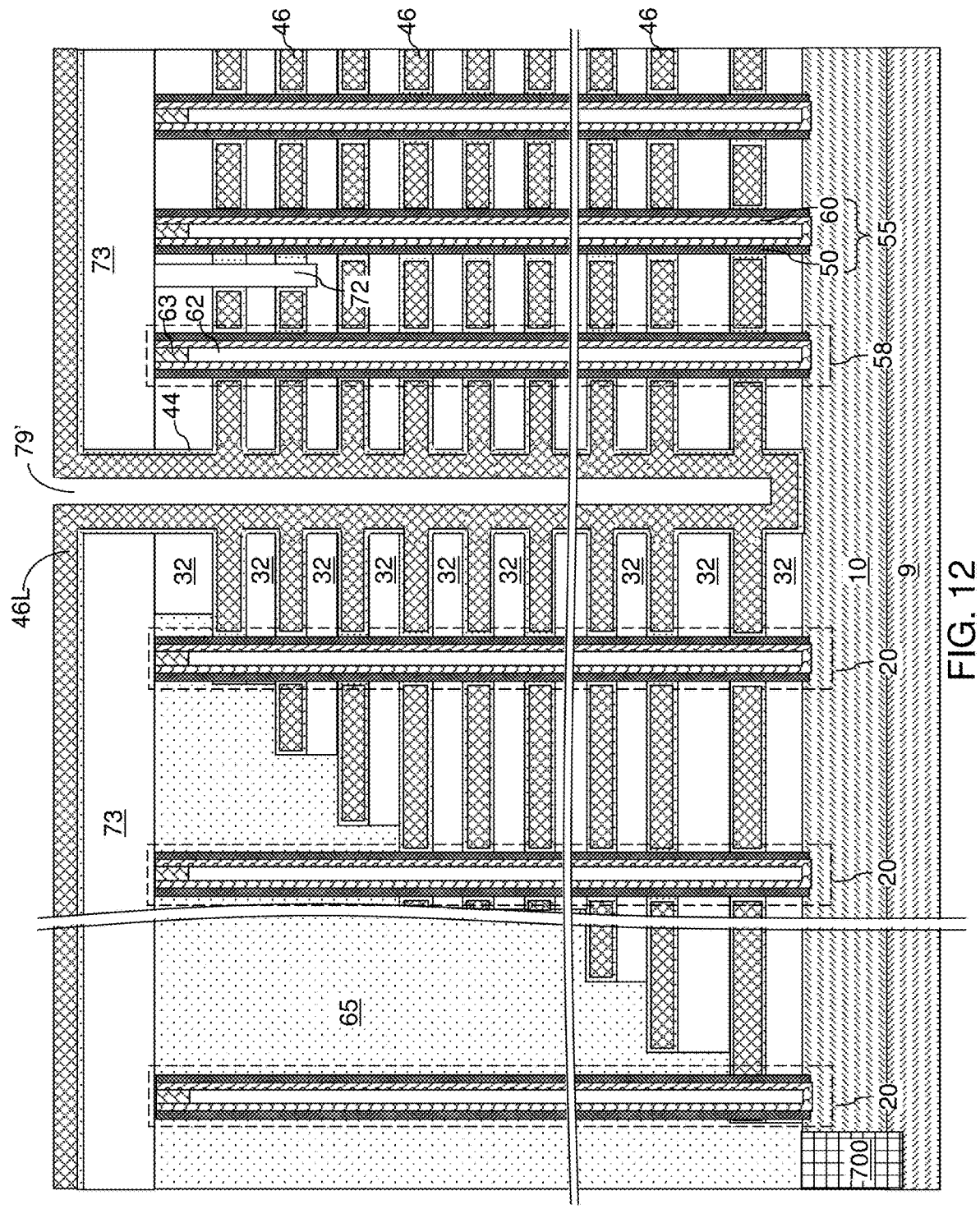
FIG. 12 is a schematic vertical cross-sectional view of the exemplary structure at a processing step of FIG. 10B or FIG. 11B according to an embodiment of the present disclosure.

Referring to FIGS. 10B, 11B, and 12, a backside barrier dielectric layer 44 may be optionally formed. The backside barrier dielectric layer 44, if present, comprises a dielectric material that functions as a control gate dielectric for the control gates to be subsequently formed in the backside recesses 43. The backside barrier dielectric layer 44 may be formed in the backside recesses 43 and on a sidewall of the backside trench 79. The backside barrier dielectric layer 44 may be formed directly on horizontal surfaces of the insulating layers 32 and sidewalls of the memory stack structures 55 within the backside recesses 43. In one embodiment, the backside barrier dielectric layer 44 may be formed by a conformal deposition process such as atomic layer deposition (ALD). The backside barrier dielectric layer 44 may consist essentially of aluminum oxide. The thickness of the backside barrier dielectric layer 44 may be in a range from 1 nm to 15 nm, such as 2 to 6 nm, although lesser and greater thicknesses may also be used.

The dielectric material of the backside barrier dielectric layer 44 may be a dielectric metal oxide such as aluminum oxide, a dielectric oxide of at least one transition metal element, a dielectric oxide of at least one Lanthanide element, a dielectric oxide of a combination of aluminum, at least one transition metal element, and/or at least one Lanthanide element. Alternatively, or additionally, the backside barrier dielectric layer 44 may include a silicon oxide layer. Preferably, the backside barrier dielectric layer 44 comprises a non-ferroelectric material. The backside barrier dielectric layer 44 may be deposited by a conformal deposition method such as chemical vapor deposition or atomic layer deposition. The backside barrier dielectric layer 44 is formed on the sidewalls of the backside trenches 79, horizontal surfaces and sidewalls of the insulating layers 32, and the portions of the sidewall surfaces of the memory stack structures 55 that are physically exposed to the backside recesses 43. A backside cavity 79' is present within the portion of each backside trench 79 that is not filled with the backside barrier dielectric layer 44.

At least one metallic material may be deposited in remaining volumes of the backside recesses. In one embodiment, the at least one metallic material may include a metallic barrier layer and a metal fill material. The metallic barrier layer includes an electrically conductive metallic material that may function as a diffusion barrier layer and/or adhesion promotion layer for a metallic fill material to be subsequently deposited. The metallic barrier layer may include a conductive metallic nitride material such as TiN, TaN, WN, or a stack thereof, or may include a conductive metallic carbide material such as TiC, TaC, WC, or a stack thereof. In one embodiment, the metallic barrier layer may be deposited by a conformal deposition process such as chemical vapor deposition (CVD) or atomic layer deposition (ALD). The thickness of the metallic barrier layer may be in a range from 2 nm to 8 nm, such as from 3 nm to 6 nm, although lesser and greater thicknesses may also be used. In one embodiment, the metallic barrier layer may consist essentially of a conductive metal nitride such as TiN.

The metal fill material may be deposited in the plurality of backside recesses 43, on the sidewalls of the at least one the backside trench 79, and over the top surface of the contact level dielectric layer 73 to form a metallic fill material layer. The metallic fill material may be deposited by a conformal deposition method, which may be, for example, chemical vapor deposition (CVD), atomic layer deposition (ALD), electroless plating, electroplating, or a combination thereof. In one embodiment, the metallic fill material layer may consist essentially of at least one elemental metal. The at least one elemental metal of the metallic fill material layer may be selected, for example, from tungsten, cobalt, ruthenium, titanium, and tantalum. In one embodiment, the metallic fill material layer may consist essentially of a single elemental metal. In one embodiment, the metallic fill material layer may be deposited using a fluorine-containing precursor gas such as $WF_6$. In one embodiment, the metallic fill material layer may be a tungsten layer including a residual level of fluorine atoms as impurities. The metallic fill material layer is spaced from the insulating layers 32 and the memory opening fill structures 58 by the metallic barrier layer, which is a metallic barrier layer that blocks diffusion of fluorine atoms therethrough.

A plurality of electrically conductive layers 46 may be formed in the plurality of backside recesses 43, and a continuous electrically conductive material layer 46L may be formed on the sidewalls of each backside trench 79 and over the contact level dielectric layer 73. Each electrically conductive layer 46 may include a portion of the metallic barrier layer and a portion of the metallic fill material layer that are located between a vertically neighboring pair of dielectric material layers such as a pair of insulating layers 32. The continuous electrically conductive material layer 46L includes a continuous portion of the metallic barrier layer and a continuous portion of the metallic fill material layer that are located in the backside trenches 79 or above the contact level dielectric layer 73.

Each sacrificial material layer 42 may be replaced with an electrically conductive layer 46. A backside cavity 79' is present in the portion of each backside trench 79 that is not filled with the backside barrier dielectric layer 44 and the continuous electrically conductive material layer 46L.

In one embodiment, each of the inter-ferroelectric dielectric portions comprises a respective portion of an inter-ferroelectric dielectric layer 543 that vertically extends from a first horizontal plane HP1 including a bottom surface of a bottommost one of the electrically conductive layers 46 to a second horizontal plane HP2 including a top surface of a topmost one of the electrically conductive layers 46 as illustrated in FIG. 10B. In one embodiment, each of the first ferroelectric material portions comprises a respective portion of a first ferroelectric material layer 542 that vertically extends from the first horizontal plane HP1 to the second horizontal plane HP2 as illustrated in FIG. 10B. In one embodiment, each of the second ferroelectric material portions comprises a respective portion of a second ferroelectric material layer 544 that vertically extends from the first horizontal plane HP1 to the second horizontal plane HP2 as illustrated in FIG. 10B.

In one embodiment, each of the inter-ferroelectric dielectric portions 553 is located entirely within a respective recess region 49R between a respective vertically neighboring pair of the insulating layers 32 as illustrated in FIG. 11B. In one embodiment, each of the first ferroelectric material portions 552 has a respective tubular shape and contacts a horizontal surface of a respective one of the insulating layers 32, and may contact two annular horizontal surfaces of the insulating layers 32 as illustrated in FIG. 11B. In one embodiment, each of the second ferroelectric material portions 554 is encapsulated by a pair of a respective one of the inter-ferroelectric material portions 553 and a respective one of the gate dielectric portions of the gate dielectric layer 555.

Figure 13A:
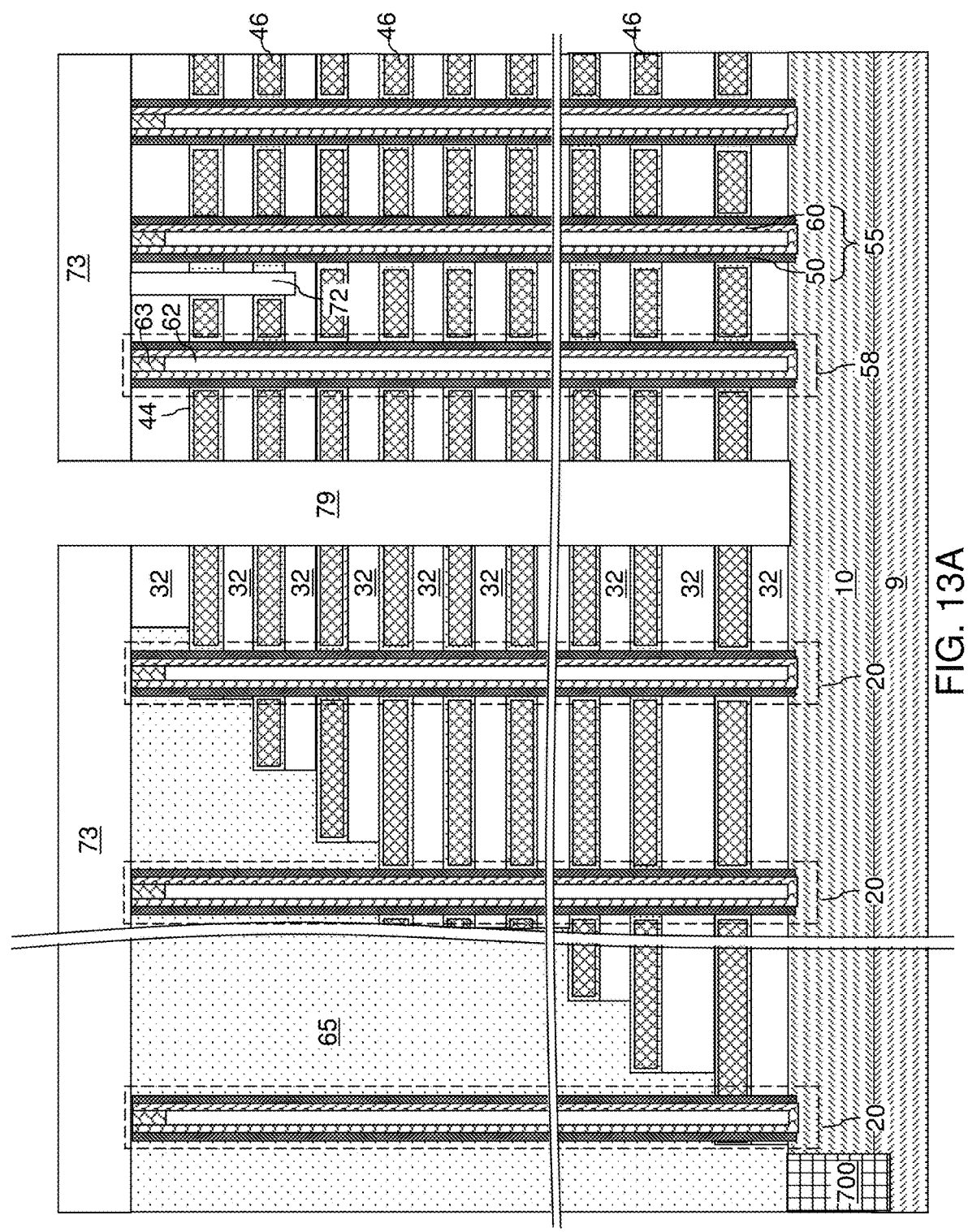
FIG. 13A is a schematic vertical cross-sectional view of the exemplary structure after removal of a deposited conductive material from within the backside trench according to an embodiment of the present disclosure.
Figure 13B:
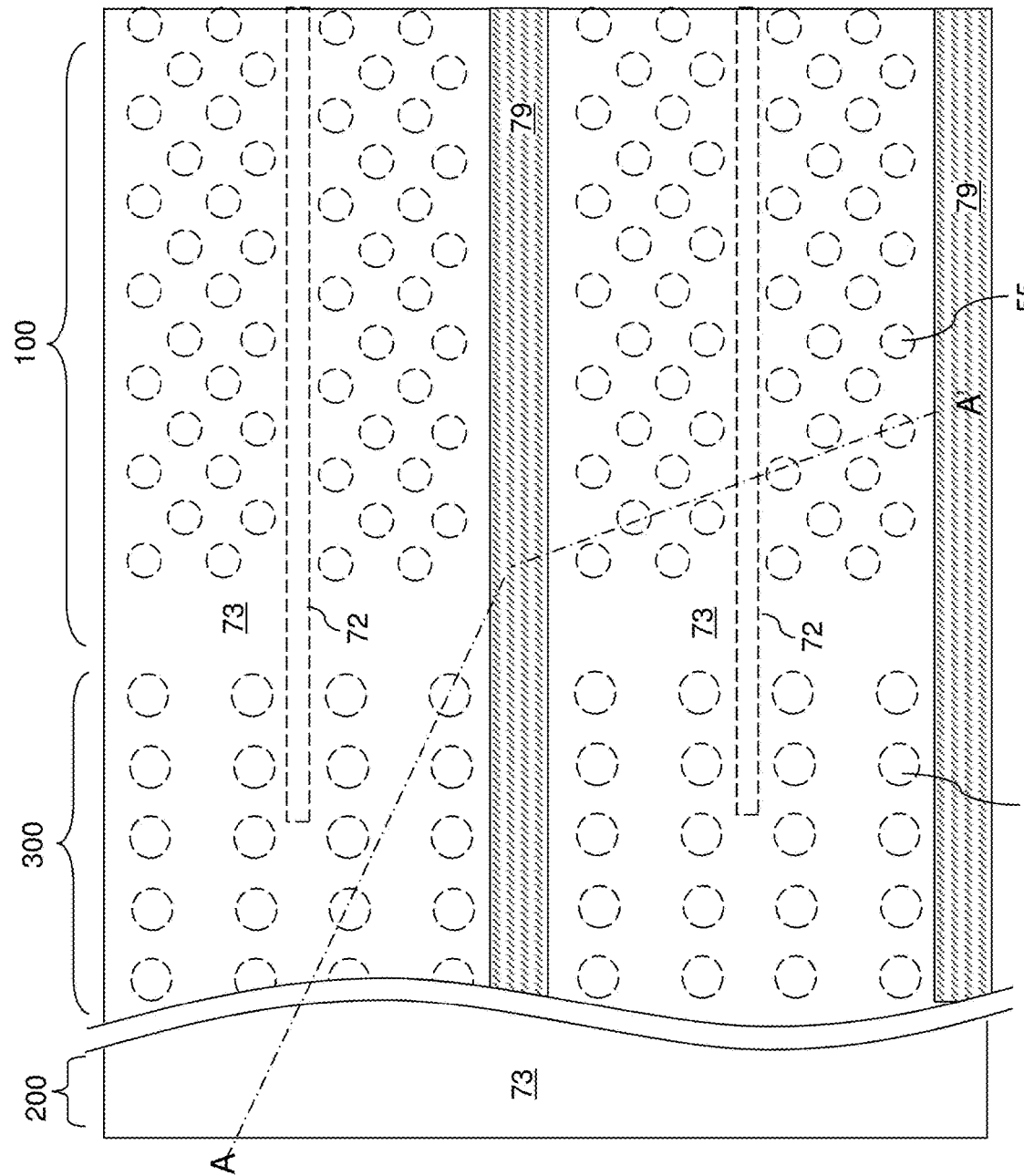
FIG. 13B is a partial see-through top-down view of the exemplary structure of FIG. 13A. The vertical plane A-A' is the plane of the schematic vertical cross-sectional view of FIG. 13A.

Referring to FIGS. 13A and 13B, the deposited metallic material of the continuous electrically conductive material layer 46L may be etched back from the sidewalls of each backside trench 79 and from above the contact level dielectric layer 73, for example, by an isotropic wet etch, an anisotropic dry etch, or a combination thereof. Each remaining portion of the deposited metallic material in the backside recesses 43 constitutes an electrically conductive layer 46. Each electrically conductive layer 46 may be a conductive line structure. Thus, the sacrificial material layers 42 are replaced with the electrically conductive layers 46.

Each electrically conductive layer 46 may function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 may be a word line that functions as a common control gate electrode for the plurality of vertical memory devices.

In one embodiment, the removal of the continuous electrically conductive material layer 46L may be selective to the material of the backside barrier dielectric layer 44. In this case, a horizontal portion of the backside barrier dielectric layer 44 may be present at the bottom of each backside trench 79. In another embodiment, the removal of the continuous electrically conductive material layer 46L may not be selective to the material of the backside barrier dielectric layer 44 or, the backside barrier dielectric layer 44 may not be used. A backside cavity 79' is present within each backside trench 79.

Figure 14:
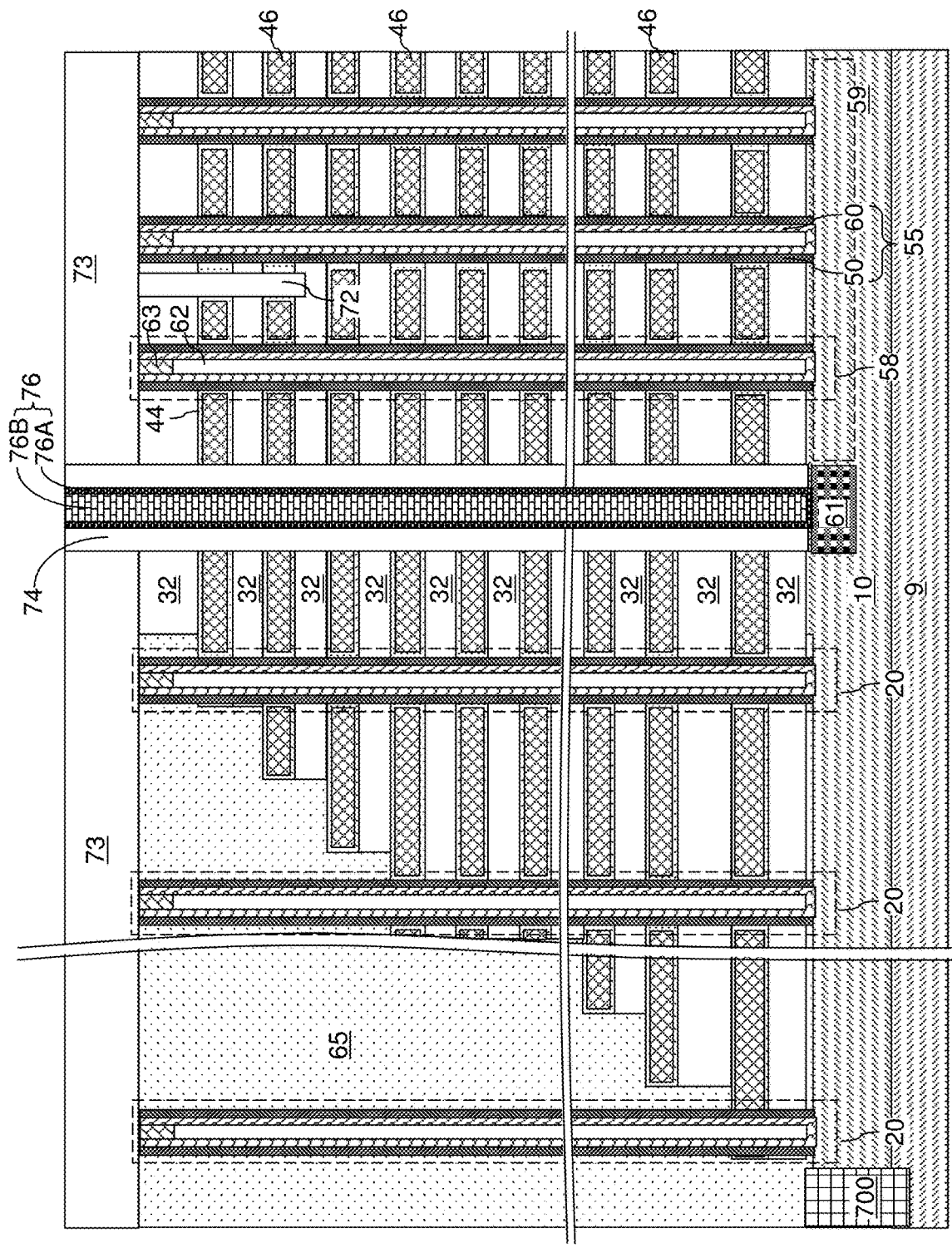
FIG. 14 is a schematic vertical cross-sectional view of the exemplary structure after formation of an insulating spacer and a backside contact structure according to an embodiment of the present disclosure.

Referring to FIG. 14, an insulating material layer may be formed in the backside trenches 79 and over the contact level dielectric layer 73 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. In one embodiment, the insulating material layer may include silicon oxide. The insulating material layer may be formed, for example, by low pressure chemical vapor deposition (LPCVD) or atomic layer deposition (ALD). The thickness of the insulating material layer may be in a range from 1.5 nm to 60 nm, although lesser and greater thicknesses may also be used.

If a backside barrier dielectric layer 44 is present, the insulating material layer may be formed directly on surfaces of the backside barrier dielectric layer 44 and directly on the sidewalls of the electrically conductive layers 46. If a backside barrier dielectric layer 44 is not used, the insulating material layer may be formed directly on sidewalls of the insulating layers 32 and directly on sidewalls of the electrically conductive layers 46.

An anisotropic etch is performed to remove horizontal portions of the insulating material layer from above the contact level dielectric layer 73 and at the bottom of each backside trench 79. Each remaining portion of the insulating material layer constitutes an insulating spacer 74. A backside cavity 79' is present within a volume surrounded by each insulating spacer 74. A top surface of the semiconductor material layer 10 may be physically exposed at the bottom of each backside trench 79.

A source region 61 may be formed at a surface portion of the semiconductor material layer 10 under each backside cavity 79' by implantation of electrical dopants into physically exposed surface portions of the semiconductor material layer 10. Each source region 61 is formed in a surface portion of the substrate (9, 10) that underlies a respective opening through the insulating spacer 74. Due to the straggle of the implanted dopant atoms during the implantation process and lateral diffusion of the implanted dopant atoms during a subsequent activation anneal process, each source region 61 may have a lateral extent greater than the lateral extent of the opening through the insulating spacer 74.

An upper portion of the semiconductor material layer 10 that extends between the source region 61 and bottom portions of the memory opening fill structures 58 constitutes a horizontal semiconductor channel 59 for a plurality of field effect transistors. The horizontal semiconductor channel 59 is connected to multiple vertical semiconductor channels 60. The horizontal semiconductor channel 59 contacts the source region 61 and a plurality of vertical semiconductor channels 60. Each source region 61 is formed in an upper portion of the substrate (9, 10). Semiconductor channels (59, 60) extend between each source region 61 and a respective set of drain regions 63. The semiconductor channels (59, 60) include the vertical semiconductor channels 60 of the memory stack structures 55.

A backside contact via structure 76 may be formed within each backside cavity 79'. Each contact via structure 76 may fill a respective backside cavity 79'. The contact via structures 76 may be formed by depositing at least one conductive material in the remaining unfilled volume (i.e., the backside cavity 79') of the backside trench 79. For example, the at least one conductive material may include a conductive liner 76A and a conductive fill material portion 76B. The conductive liner 76A may include a conductive metallic liner such as TiN, TaN, WN, TiC, TaC, WC, an alloy thereof, or a stack thereof. The thickness of the conductive liner 76A may be in a range from 3 nm to 30 nm, although lesser and greater thicknesses may also be used. The conductive fill material portion 76B may include a metal or a metallic alloy. For example, the conductive fill material portion 76B may include W, Cu, Al, Co, Ru, Ni, an alloy thereof, or a stack thereof.

The at least one conductive material may be planarized using the contact level dielectric layer 73 overlying the alternating stack (32, 46) as a stopping layer. If chemical mechanical planarization (CMP) process is used, the contact level dielectric layer 73 may be used as a CMP stopping layer. Each remaining continuous portion of the at least one conductive material in the backside trenches 79 constitutes a backside contact via structure 76.

The backside contact via structure 76 extends through the alternating stack (32, 46), and contacts a top surface of the source region 61. If a backside barrier dielectric layer 44 is used, the backside contact via structure 76 may contact a sidewall of the backside barrier dielectric layer 44.

Figure 15A:
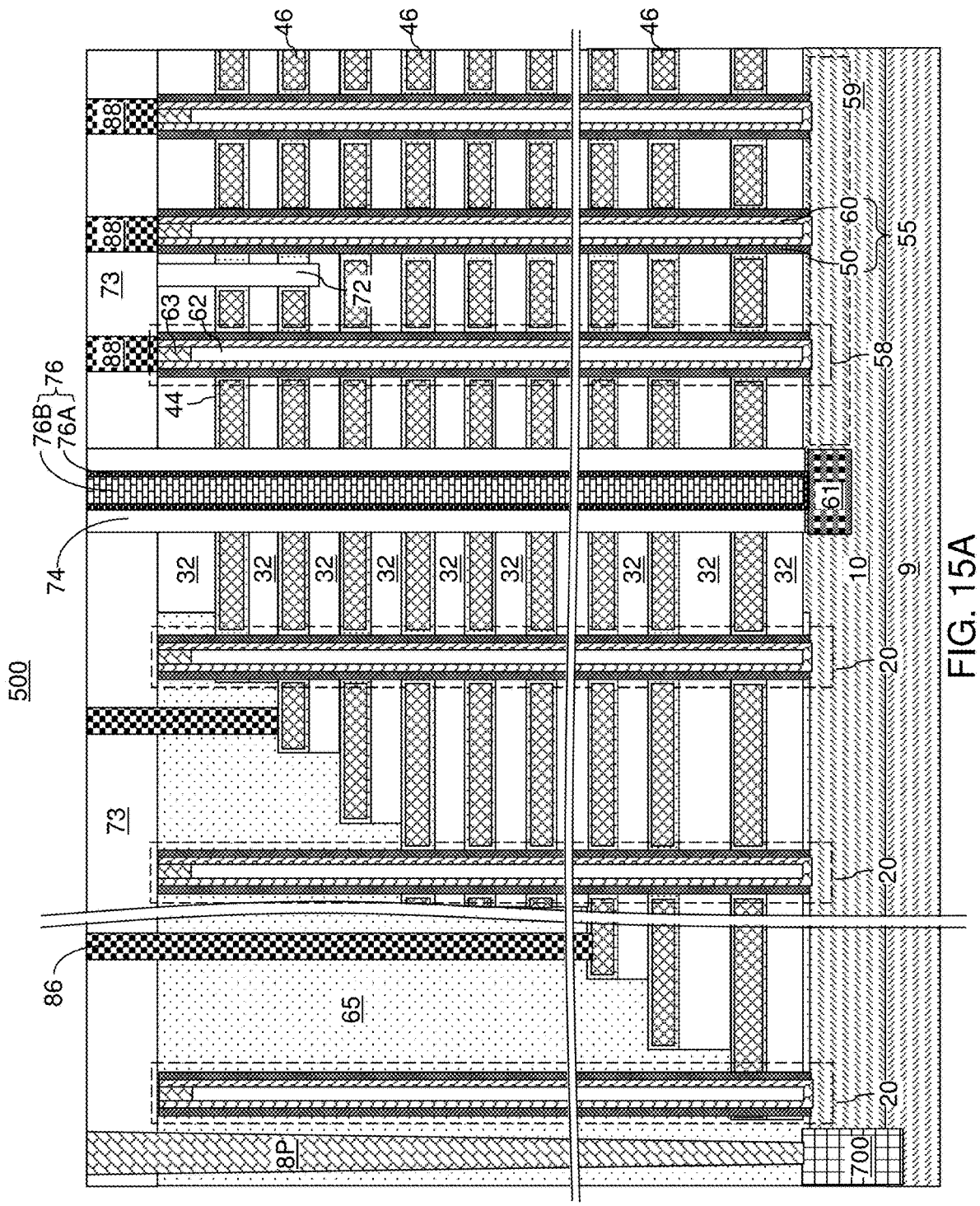
FIG. 15A is a schematic vertical cross-sectional view of the exemplary structure after formation of additional contact via structures according to an embodiment of the present disclosure.
Figure 15B:
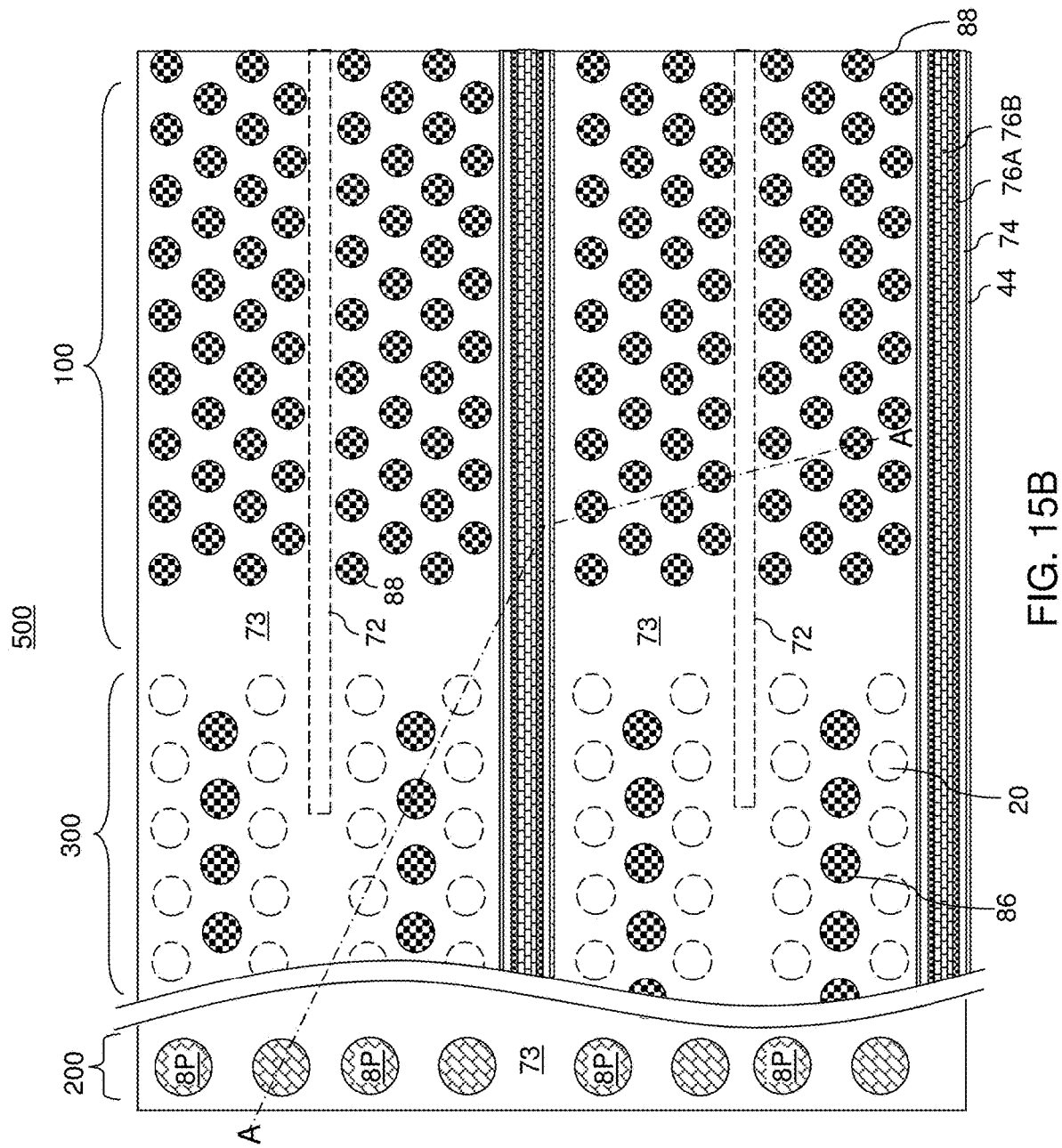
FIG. 15B is a top-down view of the exemplary structure of FIG. 15A. The vertical plane A-A' is the plane of the schematic vertical cross-sectional view of FIG. 15A.

Referring to FIGS. 15A and 15B, additional contact via structures (88, 86, 8P) may be formed through the contact level dielectric layer 73, and optionally through the retro-stepped dielectric material portion 65. For example, drain contact via structures 88 may be formed through the contact level dielectric layer 73 on each drain region 63. Word line contact via structures 86 may be formed on the electrically conductive layers 46 through the contact level dielectric layer 73, and through the retro-stepped dielectric material portion 65. Peripheral device contact via structures 8P may be formed through the retro-stepped dielectric material portion 65 directly on respective nodes of the peripheral devices. Bit lines (not shown for clarity) are then formed above and in electrical contact with the drain contact via structures 88 to complete the three-dimensional memory device 500.

Figure 16A:
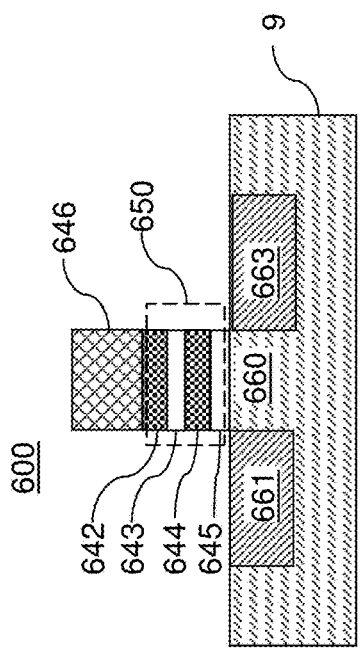
FIGS. 16A and 16B are schematic vertical cross-sectional views of the alternative structures of second and third embodiments of the present disclosure.

FIG. 16A illustrates a two dimensional memory device according to the second embodiment of the present disclosure. In the second embodiment, the memory device is a transistor 600 containing at least two ferroelectric layers between the semiconductor channel and the gate electrode. In this embodiment, the transistor 600 contains a horizontal semiconductor channel 660 in or over a semiconductor substrate 9, such as a silicon wafer. For example, the horizontal channel 660 may be a region in the top portion of the silicon wafer, a doped well in the silicon wafer or an epitaxial layer in the silicon wafer. The channel 660 is located between a source region 661 and a drain region 663, which are doped regions in the semiconductor substrate 9. A gate electrode 646 is located above the channel 660. A ferroelectric memory cell 650 is located between the gate electrode 646 and the channel 600. The ferroelectric memory cell 650 comprises a vertical stack including, from one side to another, a first ferroelectric material portion 642, an inter-ferroelectric dielectric portion 643, a second ferroelectric material portion 644, and a gate dielectric portion 645 that contacts the horizontal semiconductor channel 660. The materials of the vertical stack may be the same as those described for the memory cell 50E of the first embodiment. The barrier dielectric portion described above with respect to the first embodiment may be included or omitted in this second embodiment.

Figure 16B:
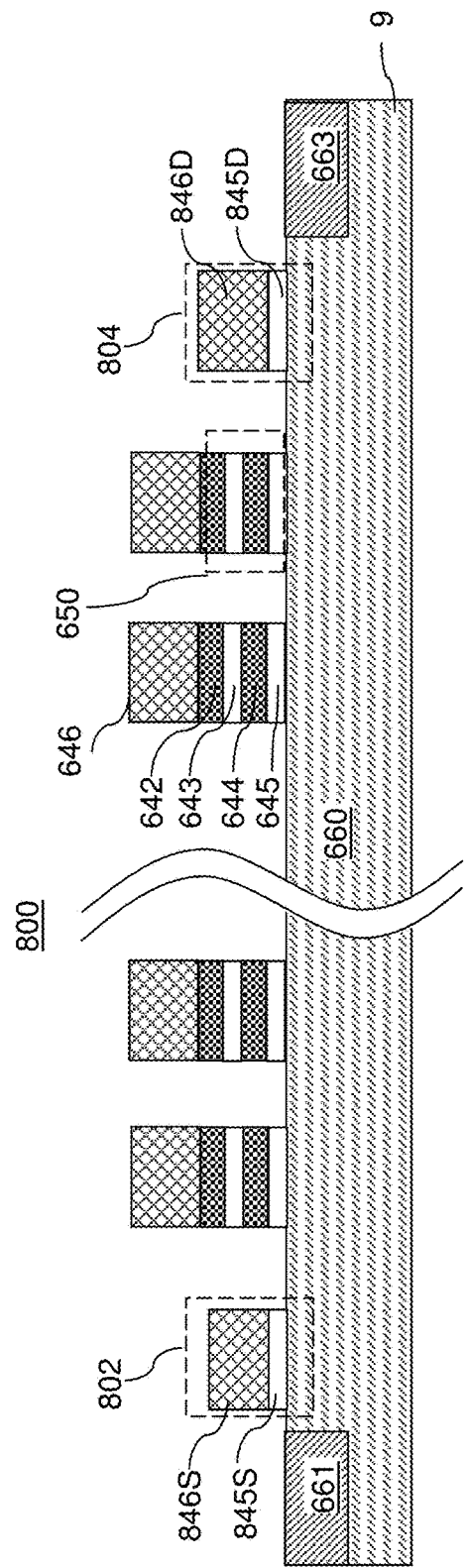

FIG. 16B illustrates a two dimensional memory device according to the third embodiment of the present disclosure. In the third embodiment, the memory device 800 is a horizontal (i.e., two-dimensional) NAND memory string. The memory device 800 is similar to the transistor 600 if the second embodiment, except that it contains a plurality of gate electrodes 646 and a plurality of ferroelectric memory cells 650 between the source and drain regions (661, 663). The memory device 800 may also include a source select transistor 802 containing a source select gate electrode 846S and a gate dielectric 845S adjacent to the source region 661 and a drain select transistor 804 containing a drain select gate electrode 846D and a gate dielectric 845D adjacent to the drain region 663.

FIGS. 17A to 17D illustrate memory devices according to the fourth embodiment of the present disclosure. In the fourth embodiment, the inter-ferroelectric dielectric portion (543, 553, 643) is omitted, and an interface (i.e., boundary) 743 is located between the first ferroelectric material layer (542, 552, 642) and the second ferroelectric material layer (544, 554, 644), as shown in FIG. 17E. Thus, in the fourth embodiment, the first ferroelectric material layer (542, 552,

642) and the second ferroelectric material layer (544, 554, 644) may physically contact each other.

As shown in FIG. 17E, the first ferroelectric material layer (542, 552, 642) and the second ferroelectric material layer (544, 554, 644) comprise polycrystalline materials containing crystalline grains 702 separated by grain boundaries 704. The respective grains 702 are interrupted at the interface 743. The majority, such as at least 80%, for example at least 90%, such as 90 to 99% of the grain boundaries 704 which contact the interface 743 at an angle of 10 to 170 degrees in first ferroelectric material layer (542, 552, 642) do not continue into the second ferroelectric material layer (544, 554, 644). Thus, as shown in FIG. 17E, the grain boundaries 704 in each ferroelectric material layer are sharply aligned to the interface 743. The interface 743 may comprise a two dimensional plane.

Figure 17A:
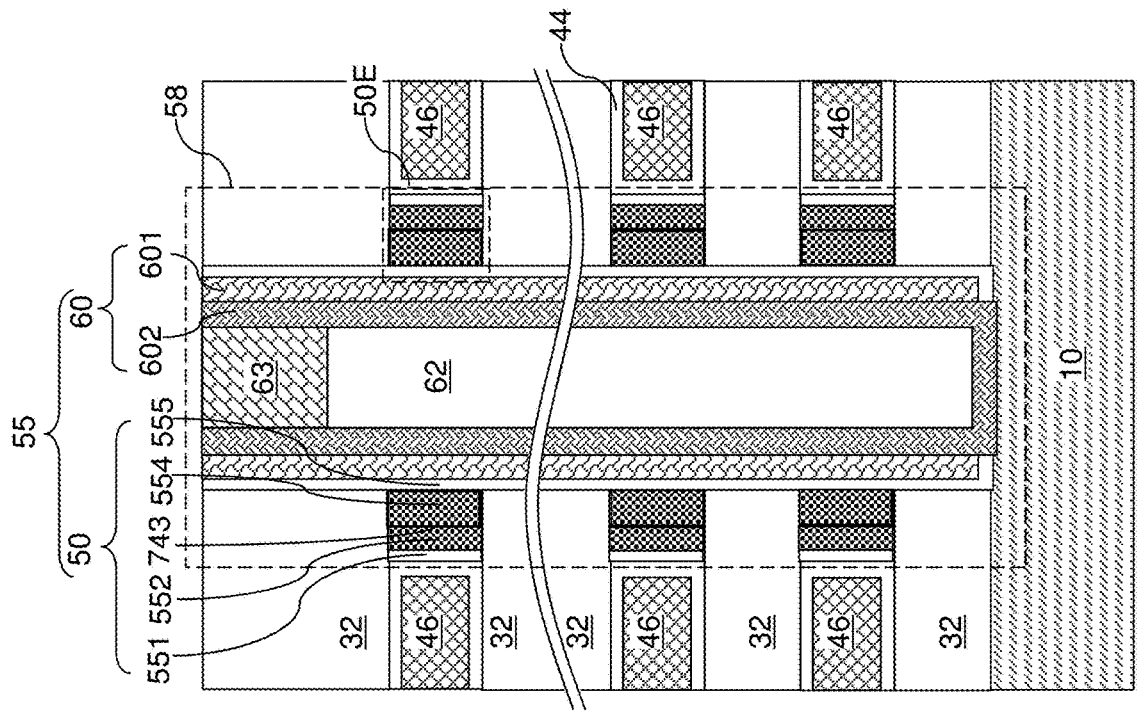

FIG. 17A illustrates a first device according to the fourth embodiment of the present disclosure. The first device is the same as the device shown in FIG. 10B, except that in FIG. 17A, the inter-ferroelectric dielectric portion 543 is omitted, and the interface 743 is located between the first ferroelectric material layer 542 and the second ferroelectric material layer 544 as described above.

Figure 17B:
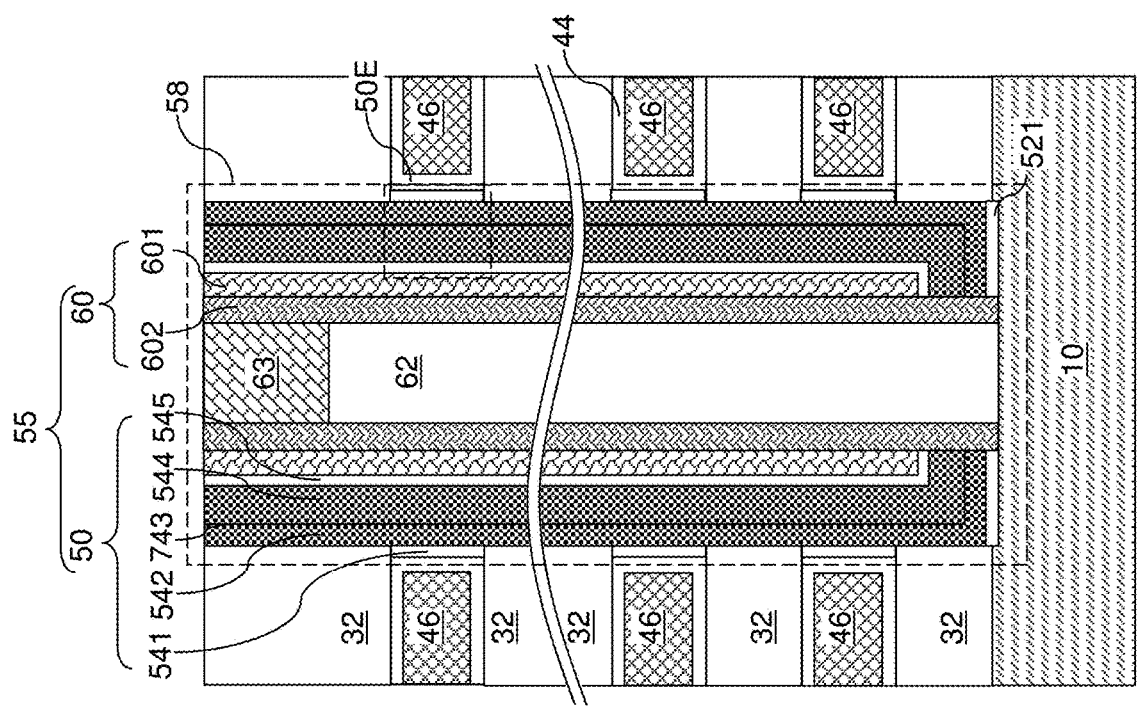
Figure 17E:
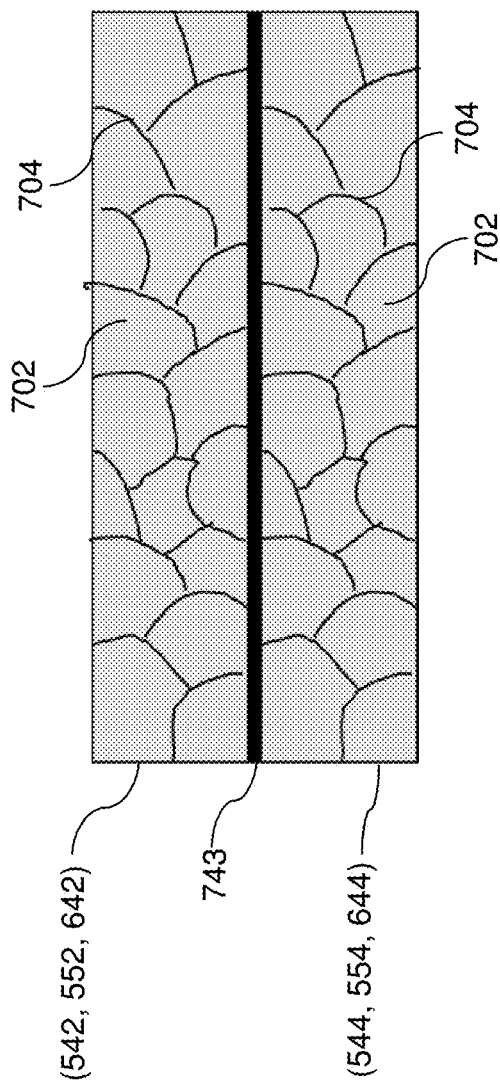
FIG. 17E is a schematic vertical cross-section view of a region of the structures of the fourth embodiment of the present disclosure.

FIG. 17B illustrates a second device according to the fourth embodiment of the present disclosure. The second device is the same as the device shown in FIG. 11B, except that in FIG. 17B, the inter-ferroelectric dielectric portion 553 is omitted, and the interface 743 is located between the first ferroelectric material layer 552 and the second ferroelectric material layer 554 as described above.

FIGS. 17C and 17D illustrate third and fourth devices according to the fourth embodiment of the present disclosure. The third and fourth devices are the same as the respective devices shown in FIGS. 16A and 16B, respectively, except that in FIGS. 17C and 17D, the inter-ferroelectric dielectric portion 643 is omitted, and the interface 743 is located between the first ferroelectric material layer 642 and the second ferroelectric material layer 644 as described above.

The interface 743 of the first and second devices of the fourth embodiment shown in FIGS. 17A and 17B may be formed by depositing the first ferroelectric material layer (542, 552) by a deposition process, such as chemical vapor deposition or atomic layer deposition followed stopping the deposition process by evacuating the source gases from the deposition chamber. This forms the first ferroelectric material layer (542, 552) having an exposed surface which comprises the interface 743. The deposition process, such as chemical vapor deposition or atomic layer deposition, is then restarted to deposit the second ferroelectric material layer (544, 554) on the exposed surface (e.g., the interface 743) of the first ferroelectric material layer (542, 552).

The interface 743 of the third and fourth devices of the fourth embodiment shown in FIGS. 17C and 17D may be formed by depositing the second ferroelectric material layer 644 by a deposition process, such as chemical vapor deposition or atomic layer deposition followed stopping the deposition process by evacuating the source gases from the deposition chamber. This forms the second ferroelectric material layer 644 having an exposed surface which comprises the interface 743. The deposition process, such as chemical vapor deposition or atomic layer deposition, is then restarted to deposit the first ferroelectric material layer 642 on the exposed surface (e.g., the interface 743) of the second ferroelectric material layer 644.

Figure 18:
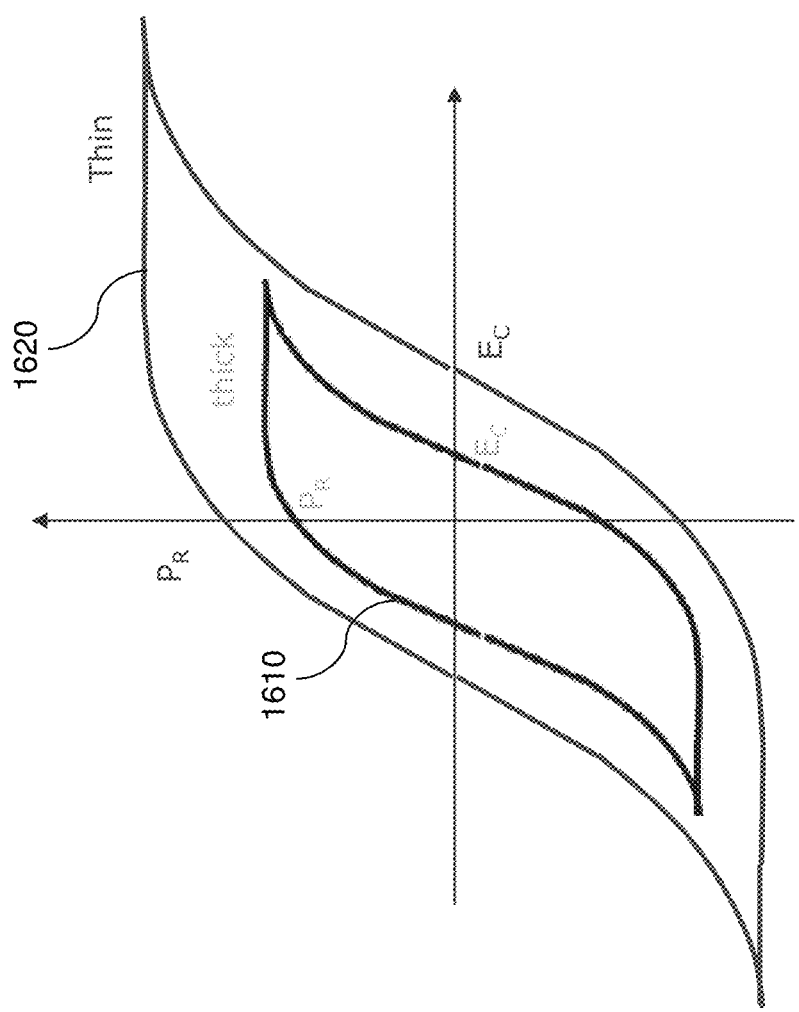
FIG. 18 shows comparison of hysteresis curves between a single layer ferroelectric layer and a multi-layer ferroelectric stack according to an embodiment of the present disclosure.

FIG. 18 shows a calculated comparison between a first hysteresis curve 1610 for a single ferroelectric layer and a second hysteresis curve 1620 for a multi-layer ferroelectric stack including a first ferroelectric material layer (542, 552, 642) and a second ferroelectric material layer (544, 554, 644) according to embodiments of the present disclosure. The total thickness of the first ferroelectric material layer (542, 552, 642) and the second ferroelectric material layer (544, 554, 644) of the second hysteresis curve may be the same as the thickness of the single ferroelectric layer of the first hysteresis curve 1610. The second hysteresis curve 1620 displays a higher coercive field E, and a greater remanent polarization $P_R$, thereby providing superior performance for a ferroelectric memory cell.

According to all drawings and various embodiments of the present disclosure, a memory device (500, 600, 800) includes a semiconductor channel (60, 660), a gate electrode (46, 646), and a stack located between the semiconductor channel and the gate electrode. The stack includes, from one side to another, a first ferroelectric material portion (542, 552, 642), a second ferroelectric material portion (544, 554, 644), and a gate dielectric portion (545, 555, 645) that contacts the semiconductor channel.

In the first embodiment illustrated in FIGS. 1-15B, the memory device comprises a three-dimensional memory device 500 containing an alternating stack (32, 46) of insulating layers 32 and electrically conductive layers comprising gate electrodes 46 located over a substrate (9, 10). The gate electrode 46 in this embodiment is one of the electrically conductive layers 46. The semiconductor channel comprises a vertical semiconductor channel 60 vertically extending through the alternating stack (32, 46). A vertical stack of ferroelectric memory cells 50E is located at each level of the electrically conductive layers 46. In this embodiment, the stack is a lateral stack which comprises one of the ferroelectric memory cells 50E.

In one embodiment, each of the gate dielectric portions (543, 553) comprises a respective portion of a gate dielectric layer (545, 555) that vertically extends from a bottommost one of the electrically conductive layers 46 to a topmost one of the electrically conductive layers 46.

In one embodiment, the three-dimensional memory device 500 comprises a plurality of memory stack structures 55 vertically extending through the alternating stack (32, 46), wherein each of the memory stack structures 55 comprises a memory film 50 and an additional vertical semiconductor channel 60, and the memory film 50 comprises the vertical stack of ferroelectric memory cells 50E. The three-dimensional memory device 500 further comprises drain regions 63 contacting a top end of a respective one of the vertical semiconductor channels 60 and having a doping of an opposite conductivity type of the vertical semiconductor channels 60. A source region 61 may be located in a semiconductor material layer 10 that underlies the alternating stack (32, 46) and located in, or on, the substrate (9, 10).

In one embodiment, each of the insulating layers 32 contacts a first ferroelectric material contained within the first ferroelectric material portions (542, 552) of the memory film 50; and each of the insulating layers 32 is spaced from a second ferroelectric material contained within the second ferroelectric material portions (544, 554) of the memory film 50 by the inter-ferroelectric dielectric material portions (543, 553) of the memory film 50 which are located between the first ferroelectric material portion and the second ferroelectric material portion.

In one embodiment, barrier dielectric portions (541, 551) are located between the gate electrodes 46 and the first ferroelectric material portion (542, 552). In one embodiment, each barrier dielectric portion (541, 551) of the memory film 50 has a tubular shape and contacts at least one horizontal surface of the insulating layers 32, and may contact two annular horizontal surfaces of the insulating layers 32. In one embodiment, each barrier dielectric portion (541, 551) has a lateral nitrogen concentration gradient such that atomic concentration of nitrogen atoms in each barrier dielectric portion (541, 551) increases with a lateral distance from an inner sidewall toward an outer sidewall.

In one embodiment, inter-ferroelectric dielectric portions (543, 553, 643) are located between the first ferroelectric material portion and the second ferroelectric material portion. Each of the inter-ferroelectric dielectric portions (543, 553, 643) has a thickness in a range from 0.3 nm to 1.2 nm.

In another embodiment the first ferroelectric material portion (542, 552, 642) contacts the second ferroelectric material portion (544, 554, 644), and an interface 743 shown in FIGS. 17A-17E is located between the first ferroelectric material portion and the second ferroelectric material portion. The interface may be two-dimensional vertical plane, as shown in FIGS. 17A and 17B, or a two-dimensional horizontal plane, as shown in FIGS. 17C and 17D.

The exemplary structures of the first embodiment may include a three-dimensional memory device 500. In one embodiment, the three-dimensional memory device 500 comprises a monolithic three-dimensional NAND memory device. The electrically conductive layers 46 may comprise, or may be electrically connected to, a respective word line of the monolithic three-dimensional NAND memory device. The substrate (9, 10) may comprise a silicon substrate. The vertical NAND memory device may comprise an array of monolithic three-dimensional NAND strings over the silicon substrate. At least one ferromagnet memory cell 50E in a first device level of the array of monolithic three-dimensional NAND strings may be located over another ferromagnetic memory cell 50E in a second device level of the array of monolithic three-dimensional NAND strings. The silicon substrate may contain an integrated circuit comprising a driver circuit (comprising a subset of the least one semiconductor device 700) for the memory device located thereon. The electrically conductive layers 46 may comprise a plurality of control gate electrodes having a strip shape extending substantially parallel to the top surface of the substrate (9, 10), e.g., between a pair of backside trenches 79. The plurality of control gate electrodes comprises at least a first control gate electrode located in a first device level and a second control gate electrode located in a second device level. The array of monolithic three-dimensional NAND strings may comprise: a plurality of semiconductor channels (59, 60), wherein at least one end portion 60 of each of the plurality of semiconductor channels (59, 60) extends substantially perpendicular to a top surface of the substrate (9, 10) and comprising a respective one of the vertical semiconductor channels 60; and a plurality ferroelectric of memory elements.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment using a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A memory device, comprising:
an alternating stack of insulating layers and electrically conductive layers comprising: gate electrodes and located over a substrate;
a vertical semiconductor channel vertically extending through the alternating stack;
and
a stack located between the vertical semiconductor channel and the electrically conductive layers, the stack including, from one side to another, a first ferroelectric material layer comprising a first ferroelectric material, a second ferroelectric material layer comprising a second ferroelectric material, and a gate dielectric layer that contacts the vertical semiconductor channel,
wherein the second ferroelectric material extends vertically from a bottommost one of the insulating layers to a topmost one of the insulating layers, and exhibits spontaneous electrical polarization in an absence of an external electric field at each level of the insulating layers; and
wherein the vertical semiconductor channel is in direct contact with a cylindrical sidewall of the first ferroelectric material layer and in direct contact with a cylindrical sidewall of the second ferroelectric material layer.

* * * * *